United States Patent
Resasco et al.

(10) Patent No.: US 7,842,387 B2
(45) Date of Patent: Nov. 30, 2010

(54) METHODS FOR GROWING AND HARVESTING CARBON NANOTUBES

(75) Inventors: Daniel E. Resasco, Norman, OK (US); Leandro Balzano, Norman, OK (US); Liang Zhang, Norman, OK (US)

(73) Assignee: The Board of Regents of The University of Oklahoma, Norman, OK (US)

( * ) Notice: Subject to any disclaimer, the term of this patent is extended or adjusted under 35 U.S.C. 154(b) by 1209 days.

(21) Appl. No.: 11/450,642

(22) Filed: Jun. 9, 2006

(65) Prior Publication Data

US 2007/0092431 A1    Apr. 26, 2007

Related U.S. Application Data

(60) Provisional application No. 60/694,545, filed on Jun. 28, 2005.

(51) Int. Cl.
   *B32B 9/00*    (2006.01)
(52) U.S. Cl. ............... 428/408; 428/446; 428/457; 428/702
(58) Field of Classification Search ............ 428/408; 423/445 B, 447.1
   See application file for complete search history.

(56) References Cited

U.S. PATENT DOCUMENTS

| | | |
|---|---|---|
| 3,645,690 A | 2/1972 | Rochte et al. |
| 3,746,657 A | 7/1973 | Miller et al. |
| 4,456,694 A | 6/1984 | Blaskie et al. |
| 4,574,120 A | 3/1986 | Thompson |
| 4,663,230 A | 5/1987 | Tennent |
| 4,847,208 A | 7/1989 | Bogen |
| 5,073,504 A | 12/1991 | Bogen |
| 5,154,889 A | 10/1992 | Muraishi |
| 5,165,909 A | 11/1992 | Tennent et al. |
| 5,225,325 A | 7/1993 | Miller et al. |
| 5,227,038 A | 7/1993 | Smalley et al. |
| 5,232,664 A | 8/1993 | Krawzak et al. |
| 5,244,787 A | 9/1993 | Key et al. |
| 5,273,905 A | 12/1993 | Muller et al. |
| 5,300,203 A | 4/1994 | Smalley |
| 5,316,452 A | 5/1994 | Bogen et al. |
| 5,355,439 A | 10/1994 | Bernstein et al. |
| 5,405,996 A | 4/1995 | Suzuki et al. |
| 5,424,054 A | 6/1995 | Bethune |
| 5,425,918 A | 6/1995 | Healey et al. |

(Continued)

FOREIGN PATENT DOCUMENTS

EP    402994  A2   12/1990

(Continued)

OTHER PUBLICATIONS

PCT/US06/22603, ISR, Aug. 31, 2007.

(Continued)

*Primary Examiner*—Timothy M Speer
(74) *Attorney, Agent, or Firm*—McAfee & Taft

(57) ABSTRACT

A method for directly growing carbon nanotubes, and in particular single-walled carbon nanotubes on a flat substrate, such as a silicon wafer, and subsequently transferring the nanotubes onto the surface of a polymer film, or separately harvesting the carbon nanotubes from the flat substrate.

5 Claims, 18 Drawing Sheets

U.S. PATENT DOCUMENTS

| | | | |
|---|---|---|---|
| 5,439,649 A | 8/1995 | Tseung et al. | |
| 5,456,897 A | 10/1995 | Moy et al. | |
| 5,482,601 A | 1/1996 | Ohshima et al. | |
| 5,500,200 A | 3/1996 | Mandeville et al. | |
| 5,543,378 A | 8/1996 | Wang | |
| 5,551,487 A | 9/1996 | Gordon et al. | |
| 5,556,517 A | 9/1996 | Smalley | |
| 5,560,898 A | 10/1996 | Uchida et al. | |
| 5,578,452 A | 11/1996 | Shi et al. | |
| 5,578,543 A | 11/1996 | Tennent et al. | |
| 5,587,141 A | 12/1996 | Ohshima et al. | |
| 5,591,312 A | 1/1997 | Smalley | |
| 5,595,707 A | 1/1997 | Copeland et al. | |
| 5,603,907 A | 2/1997 | Grochowski | |
| 5,641,466 A | 6/1997 | Ebbesen et al. | |
| 5,645,114 A | 7/1997 | Bogen et al. | |
| 5,648,056 A | 7/1997 | Tanaka | |
| 5,650,327 A | 7/1997 | Copeland et al. | |
| 5,654,199 A | 8/1997 | Copeland et al. | |
| 5,654,200 A | 8/1997 | Copeland et al. | |
| 5,675,715 A | 10/1997 | Bernstein et al. | |
| 5,695,734 A | 12/1997 | Ikazaki et al. | |
| 5,696,887 A | 12/1997 | Bernstein et al. | |
| 5,698,175 A | 12/1997 | Hiura et al. | |
| 5,707,916 A | 1/1998 | Snyder et al. | |
| 5,737,499 A | 4/1998 | Bernstein et al. | |
| 5,744,235 A | 4/1998 | Creehan | |
| 5,747,161 A | 5/1998 | Iijima | |
| 5,753,088 A | 5/1998 | Olk | |
| 5,758,033 A | 5/1998 | Bernstein et al. | |
| 5,773,834 A | 6/1998 | Yamamoto et al. | |
| 5,780,101 A | 7/1998 | Nolan et al. | |
| 5,804,141 A | 9/1998 | Chianese | |
| 5,814,290 A | 9/1998 | Niu et al. | |
| 5,819,842 A | 10/1998 | Potter | |
| 5,839,091 A | 11/1998 | Rhett et al. | |
| 5,877,110 A | 3/1999 | Snyder et al. | |
| 5,947,167 A | 9/1999 | Bogen et al. | |
| 5,948,359 A | 9/1999 | Kalra et al. | |
| 5,958,341 A | 9/1999 | Chu | |
| 5,965,267 A | 10/1999 | Nolan et al. | |
| 5,985,232 A | 11/1999 | Howard et al. | |
| 5,997,832 A | 12/1999 | Lieber et al. | |
| 6,093,574 A | 7/2000 | Druyor-Sanchez et al. | |
| 6,096,271 A | 8/2000 | Bogen et al. | |
| 6,099,965 A | 8/2000 | Tennent et al. | |
| 6,180,061 B1 | 1/2001 | Bogen et al. | |
| 6,183,693 B1 | 2/2001 | Bogen et al. | |
| 6,207,408 B1 | 3/2001 | Essenfeld et al. | |
| 6,221,330 B1 | 4/2001 | Moy et al. | |
| 6,296,809 B1 | 10/2001 | Richards et al. | |
| 6,303,094 B1 | 10/2001 | Kusunoki et al. | |
| 6,312,303 B1 | 11/2001 | Yaniv et al. | |
| 6,333,016 B1 * | 12/2001 | Resasco et al. | ......... 423/447.3 |
| 6,346,189 B1 | 2/2002 | Dai et al. | |
| 6,352,861 B1 | 3/2002 | Copeland | |
| 6,358,473 B1 | 3/2002 | Coello et al. | |
| 6,401,526 B1 | 6/2002 | Dai et al. | |
| 6,403,036 B1 | 6/2002 | Rodgers et al. | |
| 6,403,931 B1 | 6/2002 | Showalter et al. | |
| 6,413,487 B1 | 7/2002 | Resasco et al. | |
| 6,426,134 B1 | 7/2002 | Lavin et al. | |
| 6,432,866 B1 | 8/2002 | Tennent et al. | |
| 6,451,551 B1 | 9/2002 | Zhan et al. | |
| 6,472,217 B1 | 10/2002 | Richards et al. | |
| 6,479,939 B1 | 11/2002 | Yaniv et al. | |
| 6,489,171 B1 | 12/2002 | Aghassi et al. | |
| 6,495,106 B1 | 12/2002 | Kalra et al. | |
| 6,534,008 B1 | 3/2003 | Angros | |
| 6,541,261 B1 | 4/2003 | Bogen et al. | |
| 6,544,798 B1 | 4/2003 | Christensen et al. | |
| 6,573,643 B1 | 6/2003 | Kumar et al. | |
| 6,580,225 B2 | 6/2003 | Yaniv et al. | |
| 6,582,962 B1 | 6/2003 | Richards et al. | |
| 6,594,537 B1 | 7/2003 | Bernstein et al. | |
| 6,596,187 B2 | 7/2003 | Coll et al. | |
| 6,599,961 B1 | 7/2003 | Pienkowski et al. | |
| 6,632,598 B1 | 10/2003 | Zhang et al. | |
| 6,649,368 B1 | 11/2003 | Aghassi et al. | |
| 6,656,339 B2 | 12/2003 | Talin et al. | |
| 6,664,722 B1 | 12/2003 | Yaniv et al. | |
| 6,673,620 B1 | 1/2004 | Loeffler et al. | |
| 6,683,783 B1 | 1/2004 | Smalley et al. | |
| 6,692,717 B1 | 2/2004 | Smalley et al. | |
| 6,699,457 B2 | 3/2004 | Cortright et al. | |
| 6,752,977 B2 | 6/2004 | Smalley et al. | |
| 6,756,025 B2 | 6/2004 | Smalley et al. | |
| 6,761,870 B1 | 7/2004 | Smalley et al. | |
| D495,425 S | 8/2004 | Goris et al. | |
| 6,783,733 B2 | 8/2004 | Bogen et al. | |
| 6,827,901 B2 | 12/2004 | Copeland et al. | |
| 6,855,559 B1 | 2/2005 | Christensen et al. | |
| 6,919,064 B2 | 7/2005 | Resasco et al. | |
| 6,936,233 B2 | 8/2005 | Smalley et al. | |
| 6,939,525 B2 | 9/2005 | Colbert et al. | |
| 6,955,800 B2 | 10/2005 | Resasco et al. | |
| 6,962,892 B2 | 11/2005 | Resasco et al. | |
| 6,969,690 B2 | 11/2005 | Zhou et al. | |
| 6,994,907 B2 | 2/2006 | Resasco et al. | |
| 7,094,386 B2 | 8/2006 | Resasco et al. | |
| 7,153,903 B1 | 12/2006 | Barraza et al. | |
| 7,323,540 B2 | 1/2008 | Velev et al. | |
| 2001/0031900 A1 | 10/2001 | Margrave et al. | |
| 2002/0084410 A1 | 7/2002 | Colbert et al. | |
| 2002/0094311 A1 | 7/2002 | Smalley et al. | |
| 2002/0096634 A1 | 7/2002 | Colbert et al. | |
| 2002/0127169 A1 | 9/2002 | Smalley et al. | |
| 2002/0127171 A1 | 9/2002 | Smalley et al. | |
| 2002/0159944 A1 | 10/2002 | Smalley et al. | |
| 2002/0165091 A1 | 11/2002 | Resasco et al. | |
| 2003/0022391 A1 | 1/2003 | Richards et al. | |
| 2003/0077515 A1 | 4/2003 | Chen et al. | |
| 2003/0089893 A1 | 5/2003 | Niu et al. | |
| 2003/0091496 A1 | 5/2003 | Resasco et al. | |
| 2003/0124729 A1 | 7/2003 | Christensen et al. | |
| 2003/0147802 A1 | 8/2003 | Smalley et al. | |
| 2003/0175200 A1 | 9/2003 | Smalley et al. | |
| 2003/0180526 A1 | 9/2003 | Winey et al. | |
| 2003/0203493 A1 | 10/2003 | Lemme et al. | |
| 2003/0211630 A1 | 11/2003 | Richards et al. | |
| 2004/0002163 A1 | 1/2004 | Reinhardt et al. | |
| 2004/0009346 A1 | 1/2004 | Jang et al. | |
| 2004/0028859 A1 | 2/2004 | LeGrande et al. | |
| 2004/0131532 A1 | 7/2004 | Resasco et al. | |
| 2004/0197260 A1 * | 10/2004 | Resasco et al. | ......... 423/447.3 |
| 2004/0241896 A1 | 12/2004 | Zhou et al. | |
| 2005/0042162 A1 | 2/2005 | Resasco et al. | |
| 2005/0053542 A1 | 3/2005 | Harutyunyan | |
| 2005/0112048 A1 | 5/2005 | Tsakalakos et al. | |
| 2005/0112051 A1 | 5/2005 | Liu et al. | |
| 2006/0039848 A1 | 2/2006 | Matarredona et al. | |
| 2006/0039849 A1 | 2/2006 | Resasco et al. | |
| 2006/0057055 A1 | 3/2006 | Resasco et al. | |
| 2006/0104886 A1 | 5/2006 | Wilson | |
| 2006/0257564 A1 | 11/2006 | Liu et al. | |

FOREIGN PATENT DOCUMENTS

| | | |
|---|---|---|
| EP | 0 945 402 | 9/1999 |
| EP | 01 93 9821 | 6/2004 |
| JP | 06-228824 | 8/1994 |
| JP | 11-139815 | 5/1999 |
| JP | 99-139815 | 5/1999 |
| WO | WO 97/09272 | 3/1997 |

| WO | WO 98/42620 | 1/1998 |
| WO | WO 98/39250 | 9/1998 |
| WO | WO98/42620 | 10/1998 |
| WO | 9944030 | 9/1999 |
| WO | WO 00/14507 | 3/2000 |
| WO | WO 00/17102 | 3/2000 |
| WO | WO 00/26138 | 5/2000 |
| WO | WO 00/73205 | 12/2000 |
| WO | WO 01/94260 | 12/2001 |
| WO | WO 02/060813 | 8/2002 |
| WO | WO 03/048038 | 6/2003 |
| WO | WO 04/001107 | 12/2003 |

OTHER PUBLICATIONS

W. Z. Li et al., Large-Scale Synthesis of Aligned Carbon Nanotubes, pp. 1700-1703, Science, Dec. 6, 1996, vol. 274.
U.S. Appl. No. 60/076,198, filed Feb. 27, 1998, Ford et al.
U.S. Appl. No. 60/142,789, filed Jul. 8, 1999, Angros.
U.S. Appl. No. 60/375,679, filed Apr. 26, 2002, Ventana.
F. Tuinstra and J.L. Koenig, J. Chem. Phys. 53 (1970) 1126.
M.S. Dresselhaus and P.C. Eklund, Adv. Phys. 49 (2000) 705.
A. Jorio, et al., New J. Phys. 5 (2003) 139.
S.M. Bachilo, et al., J. American Chem. Soc. 125 (2003) 11186.
D.E. Resasco, et al., American Institute of Physics Conf. Proc. 723 (2004) 27.
F. Hennrich, et al., J. Phys. Chem. B 109 (2005) 10567.
F. Buffa, et al., Macromolecules 38 (2005) 8258.
Shigeo Maruyama, et al., "Growth Process of Vertically Aligned Single-Walled Carbon Nanotubes", Chemical Physics Letters 403 (2005) 320-323.
Suguru Noda, et al. "A Simple Combinatorial Method to Discover Co-Mo Binary Catalysts That Grow Vertically Aligned Single-Walled Carbon Nanotubes", Carbon 44 (2006) 1414-1419.
Liang Zhang, et al. "Controlling the Growth of Vertically Oriented Single-Walled Carbon Nanotubes by Varying the Density of Co-Mo Catalyst Particles", Chemical Physics Letters 422 (2006) 198-203.
PCT/US00/18686, Angros—Search Report, Nov. 16, 2000.
P. Skytt, P. Glans, D.C. Mancini, J.-H. Guo, N. Wassdahl, and J. Nordgren, Y. Ma, *Phys. Rev. B* 50, 10457-10461 (1994).
S. Banerjee, T. Hemraj-Benny, M. Balasubramanian, D.A. Fischer, J.A. Misewich, and S.S. Wong, *ChemPhysChem* 2004, 5, 1416-1422.
F. Sete, J. Stohr, A.P. Hitchcock, *J. Chem. Phys.* 81, 4906 (1984).
Kuznetsova, A.; Popova, I.; Yates, J.T., Jr.; Bronikowski, M.J.; Huffman, C.B.; Liu, J.: Smalley, R.E.; Hwu, H.H.; Chen, J.G. *J. Am. Chem. Soc.* 2001, 123, 10699.
Outka, D. et al. *J. Chem. Phys.* 1988, 88, 4076.
S. Banerjee, T. Hemraj-Benny, S. Sambasivan, D.A. Fischer, J.A. Misewich, and S.S. Wong, *J. Phys. Chem. B* 2005, 109, 8489-8495.
PCT/US00/15362, Jan. 6, 2000, The Board of Regents of the University of Oklahoma, International Search Report.
PCT/US02/23155, Jul. 19, 2002, The Board of Regents of the University of Oklahoma, International Search Report.
PCT/US03/19664, Mar. 31, 2004, The Board of Regents of the University of Oklahoma, International Search Report.
PCT/US04/12986, May 26, 2005, The Board of Regents of the University of Oklahoma, International Search Report.
Niyogi et al; Chromatographic Purification of Soluble Single-Walled Carbon Nanotubes (s-SWNTs); J. Am. Chem. Soc. 2001, 123, 733-734.
NEC Corp.; Patent Abstracts of Japan, vol. 1996, No. 12, Dec. 26, 1996, and JP 08 198611 A (Aug. 6, 1996) Abstract.
Pompeo et al.; Water Solubilization of Single-Walled Carbon Nanotubes by Functionalization with Glucosamine; Nano Letters 2002 vol. 2, No. 4, 369-373.
Qian et al.; Load transfer and deformation mechanisms in carbon nanotube-polystyrene composites; Applied Physics Letters, vol. 76, No. 20, May 15, 2000, pp. 2868-2870.
Razavi et al.; Metallocene catalysts technology and environment; Chemistry 3 (2000) 615-625.
Rinzler et al.; Large-scale purification of single-wall carbon nanotubes: process, product, and characterization; Applied Physics A, vol. 67 (1998), pp. 29-37.
Saito et al.; Electronic Structure of chiral graphen tubules; Appl. Phys. Lett. 60 (18), May 4, 1992; pp. 2204-2206.
Sears et al.; Raman scattering from polymerizing styrene. I. Vibrational mode analysis; J. Chem. Phys., vol. 75, No. 4, (1981) pp. 1589-1598.
Shaffer et al.; Fabrication and Characterization of Carbon Nanotube/Poly(vinyl alcohol) Composites; Adv. Mater. 1999, 11, No. 11; 937-941.
Thess et al.; Crystalline Ropes of Metallic Carbon Nanotubes; Science vol. 273, Jul. 26, 1996; 483-487.
Tiarks et al; Encapsulation of Carbon Black by Miniemulsion Polymerization; Macromol. Chem. Phys. 2001, 202, 51-60.
Tiarks et al; Silica Nanoparticles as Surfactants and Fillers for Latexes Made by Miniemulsion Polymerization; Langmuir 2001, 17, 5775-5780.
Tohji et al; Purification Procedure for Single-Walled Nanotubes; J. Phys. Chem. B. 1997, 101, 1974-1978.
Willems et al.; Control of the outer diameter of thin carbon nanotubes synthesized by catalytic decomposition of hydrocarbons; Chemical Physics Letters 317 (2000) 71-76.
Yakobson, Boris I.;Fullerene Nanotubes: C1,000,000 and Beyond; American Scientist, vol. 85, Jul.-Aug. 1997; 325-336.
Zhao et al.; Chromatographic Purification and Properties of Soluble Single-Walled Carbon Nanotubes; J. Am. Chem. Soc.; pp. A-E.
Zhu et al.; Direct Synthesis of Long Single-Walled Carbon Nanotube Strands; Science, vol. 296, May 3, 2002, 884-886.
Yin et al.; Silver Nanowires Can Be Directly Coated with Amorphous Silica to Generate Well-Controlled Coaxial Nanocables of Silver/Silica; Nano Letters 2002, vol. 2, No. 4, 427-430.
U.S. Appl. No. 60/101,093, filed Sep. 18, 1998.
U.S. Appl. No. 60/106,917, filed Nov. 3, 1998, Smalley et al.
U.S. Appl. No. 60/114,588, filed Dec. 31, 1998, Smalley et al.
U.S. Appl. No. 60/117,287, filed Jan. 26, 1999, Smalley et al.
U.S. Appl. No. 60/161,728, filed Oct. 27, 1999, Smalley et al.
Alvarez et al.; Synergism of Co and Mo in the catalytic production of single-wall carbon nanotubes by decomposition of CO; Carbon 39 (2001) 547-558.
Anderson et al.; 50 nm Polystyrene Particles via Miniemulsion Polymerization; Macromolecules 2002, 35, 574-576.
Bachilo et al; Structure-Assigned Optical Spectra of Single-Walled Carbon Nanotubes; Science, vol. 298, Dec. 20, 1992, pp. 2361-2366.
Bahr et al.; Functionalization of Carbon Nanotubes by Electrochemical Reduction of Aryl Diazonium Salts: A Bucky Paper Electrode; J. Am. Chem. Soc. 2001, 123, 6536-6542.
Bandow et al.; Effect of the Growth Temperature on the Diameter Distribution and Chirality of Single-Wall Carbon Nanotubes; The American Physical Society, Physical Review Letters, vol. 80, No. 17, Apr. 27, 1998; pp. 3779-3782.
Bandow et al.; Purification of Single-Wall Carbon Nanotubes by Microfiltration; J. Phys. Chem B 1997, 101, 8839-8842.
Bethune et al.; Cobalt-catalysed growth of carbon nanotubes with single-atomic-layer walls; Nature vol. 363, Jun. 17, 1993; pp. 605-607.
Bower et al.; Deformation of carbon nanotubes in nanotube-polymer composites; Applied Physics Letters; vol. 74, No. 22; May 31, 1999; pp. 3317-3319.
Brotons et al.; Catalytic influence of bimetallic phases for the synthesis of single-walled carbon nanotubes; Journal of Molecular Catalysis A: Chemical 116 (1997) 397-403.
Cadek et al.; Mechanical and Thermal Properties of CNT and CNF Reinforced Polymer Composites; American Institute of Physics 2002; pp. 562-565.
Cassell et al.; Large Scale CVD Synthesis of Single-Walled Carbon Nanotubes; J. Phys. Chem. B 1999, 103, pp. 6484-6492.
Chattopadhyay et al.; A Route for Bulk Separation of Semiconducting from Metallic Single-Wall Carbon Nanotubes; J. Am. Chem. Soc. 2003, 125, 3370-3375.
Chaturvedi et al.; Properties of pure and sulfided NiMoO4 and CoMoO4 catalysts; TPR, XANES and time-resolved XRD studies; Database Accession No. EiX99044490981 XP002246342, Proceedings of the 1997 Mrs Fall Symposium, Boston, MA, USA, Dec. 2-4, 1997; Mater Res SocSymp Proc. Materials Research Society Symposium-Proceedings, Recent Advances in Catalytic Materials, (1998), Mrs. Warrendale, PA, USA.
Che et al.; Chemical Vapor Deposition Based Synthesis of Carbon Nanotubes and Nanofibers Using a Template Method; Chem Mater. 1998, 10, pp. 260-267.
Chen et al.; Growth of Carbon Nanotubes by Catalytic Decomposition of CH4 or CO on a Ni-MgO Catalyst; Carbon vol. 35, No. 10-11 (1997) pp. 1495-1501.
Chen et al.; Dissolution of Full-Length Single-Walled Carbon Nanotubes; J. Phys. Chem. B 2001, 105, 2525-2528.
Chen et al.; Bulk Separative Enrichment in Metallic or Semiconducting Single-Walled Carbon Nanotubes; Nano Letters vol. 0, No. 0 A-E.
Cheng et al.; Bulk morphology and diameter distribution of single-walled carbon nanotubes synthesized by catalytic decomposition of hydrocarbons; Chemical Physics Letters 289 (1998) 602-610.
Cheng et al.; Large-scale and low-cost synthesis of single-walled carbon nanotubes by the catalytic pyrolysis of hydrocarbons; Applied Physics Letters vol. 72, No. 25, Jun. 22, 1998; pp. 3282-3284.
Dai et al.; Single-wall nanotubes produced by methal-catalyzed disproportionation of carbon monoxide; Chemical Physics Letters 260 (1996) 471-475.
Database Accession No. 1999-366878, Cano, "Canon KK"; XP-002149235; May 25, 1999.
De Boer et al; The cobalt-molybdenum interaction in CoMo/SiO2 catalysts: A CO-oxidation study; Solid State Ionics 63-65 (1993) 736-742.
Deng et al.; Hybrid Composite of Polyaniline Containing Carbon Nanotube; Chinese Chemical Letters vol. 12, No. 11 (2001); pp. 1037-1040.
Dyke et al.; Unbundled and Highly Functionalized Carbon Nanotubes from Aqueous Reactions; Nano Letters 2003 vol. 3, No. 9; pp. 1215-1218.
Fonseca et al; Synthesis of single- and multi-wall carbon nanotubes over supported catalysts; Appl. Phys. A 67, (1998) 11-22.
Franco et al.; Electric and magnetic properties of polymer electrolyte/carbon black composites; Solid State Ionics 113-115 (1998) 149-160.
Gaspar et al.; The influence of Cr precursors in the ethylene polymerization on Cr/SiO2 catalysts; Applied Catalysis A: General 227 (2002) 241-254.
Gong et al.; Surfactant-Assisted Processing of Carbon Nanotube/Polymer Composites; Chem. Mater. 2000, 12, 1049-1052.
Govindaraj et al; Carbon Structures Obtained by the Disproportionation of Carbon Monoxide Over Nickel Catalysts; Materials Research Bulletin vol. 33, No. 4, (1998) pp. 663-667.
Hafner et al.; Catalytic growth of single-wall carbon nanotubes from metal particles; Chemical Physics Letters 296 (1998) 195-202.
Hamon et al.; End-group and defect analysis of soluble single-walled carbon nanotubes; Chemical Physics Letters 347 (2001) 8-12.
Hernadi et al.; Catalytic synthesis of carbon nanotubes using zeolite support; Elsevier Science Inc. (1996) 8 pages.

Hwang et al.; Carbon nanotube reinforced ceramics; J. Mater. Chem. 2001, 11, 1722-1725.
Hyperion Catalysts International; Unique Slough Resistant SR Series ESD Thermopolastic Product Line Offers Reduced Particle Contamination for Demanding Electronic Applications; http://www.flbrils.com/eds.htm; Nov. 19, 2001; 8 pages.
Iijima; Helical microtubules of graphitic carbon; Nature vol. 354, Nov. 7, 1991; pp. 56-58.
Iijima et al; Single-shell carbon nanotubes of 1nm diameter; Nature, vol. 363, Jun. 17, 1993; pp. 603-605.
Ivanov et al.; The study of carbon nanotubules produced by catalytic method; Chemical Physics Letters 223 (1994) 329-335.
Jin et al.; Alignment of carbon nanotubes in a polymer matrix by mechanical stretching; Applied Physics Letters, vol. 73, No. 9, Aug. 31, 1998; 1197-1199.
Journet et al.; Large-scale production of single-walled carbon nanotubes by the electric-arc technique; Nature vol. 388, Aug. 21, 1997; pp. 756-758.
Kitiyanan et al.; Controlled production of single-wall carbon nanotubes by catalytic decomposition of CO on bimetallic Co-Mo catalysts; Chemical Physics Letters 317 (2000) 497-503.
Krishnankutty et al.; The effect of copper on the structural characteristics of carbon filaments produced from iron catalyzed decomposition of ethylene; Catalysts Today 37 (1997) 295-307.
Landfester; Miniemulsion polymerization; Jun. 24, 2003; http://www.mpikg-golm.mpg.de/kc/landfester.
Landfester; Polyreactions in Miniemulsions; Macromol. Rapid Commun, 2001, 22, 896-936.
Landfester; The Generation of Nanoparticles in Miniemulsions; Adv. Mater. 2001, 13, No. 10, May 17; 765-768.
Li et al.; Large-Scale Synthesis of Aligned Carbon Nanotubes; Science, vol. 274, Dec. 6, 1997; 1701-1703.
McCarthy et al.; A Microscopic and Spetroscopic Study of Interactions between Carbon Nanotubes and a Conjugated Polymer; J. Phys. Chem. B 2002, 106, 2210-2216.
Chen et al.; Large-scale controlled synthesis of silica nanotubes using zinc oxide nanowires as templates; Nanotechnology 16 (2005) 1978-1982.
Qian et al.; Synthesis of uniform carbon@silica nanocables and luminescent silica nanotubes with well controlled inner diameters; Nanotechnology 17 (2006) 5995-5999.
Resasco et al.; Controlled growth of SWCNT on solid catalysts with narrow (n,m) distribution; School of Chemical Engineering and Materials Science, University of Oklahoma (2004) 5 pages.
Terrado et al.; Aligned carbon nanotubes grown on alumina and quartz substrates by a simple thermal CVD process; Diamond & Related Materials 15 (2006) 1059-1063.
Zygmunt et al.; Novel Silica Nanotubes with a High Aspect Ratio—Synthesis and Structural Characterization; Adv. Mater. 15, No. 18, Sep. 16, 2003, 1538-1541.

* cited by examiner

US 7,842,387 B2

METHODS FOR GROWING AND HARVESTING CARBON NANOTUBES

CROSS-REFERENCE TO RELATED APPLICATIONS

The present application claims the benefit of U.S. Provisional Application Ser. No. 60/694,545, filed Jun. 28, 2005, in accordance with 35 U.S.C. §119(e), which application is hereby expressly incorporated herein by reference in its entirety.

BACKGROUND OF THE INVENTION

This invention is related to the field of catalysts for producing carbon nanotubes and methods of their use, and more particularly, but not by way of limitation, single-walled carbon nanotubes, and to methods to produce polymers and products comprising carbon nanotubes.

Carbon nanotubes (CNTs) are seamless tubes of graphite sheets with full fullerene caps which were first discovered as multi-layer concentric tubes or multi-walled carbon nanotubes (MWNTs) and subsequently as single-walled carbon nanotubes (SWNTs) in the presence of transition metal catalysts. Carbon nanotubes have shown promising applications including nanoscale electronic devices, high strength materials, electron field emission, tips for scanning probe microscopy, and gas storage.

Generally, single-walled carbon nanotubes are preferred over multi-walled carbon nanotubes for use in these applications because they have fewer defects and are therefore stronger and more conductive than multi-walled carbon nanotubes of similar diameter. Defects are less likely to occur in SWNTs than in MWNTs because MWNTs can survive occasional defects by forming bridges between unsaturated carbon valances, while SWNTs have no neighboring walls to compensate for defects.

SWNTs in particular exhibit exceptional chemical and physical properties that have opened a vast number of potential applications.

However, the availability of CNTs and SWNTs in particular in quantities and forms necessary for practical applications is still problematic. Large scale processes for the production of high quality SWNTs are still needed, and suitable forms of the SWNTs for application to various technologies are still needed. It is to satisfying these needs that the present invention is directed.

Previous U.S. patents and applications directed to catalysts and methods of producing carbon nanotubes, including U.S. Pat. Nos. 6,333,016, 6,413,487, U.S. Published Application 2002/0165091 (U.S. Ser. No. 09/988,847), and U.S. Published Application 2003/0091496 (U.S. Ser. No. 10/118,834), are hereby expressly incorporated by reference herein in their entireties.

DESCRIPTION OF THE INVENTION

Figure 2:
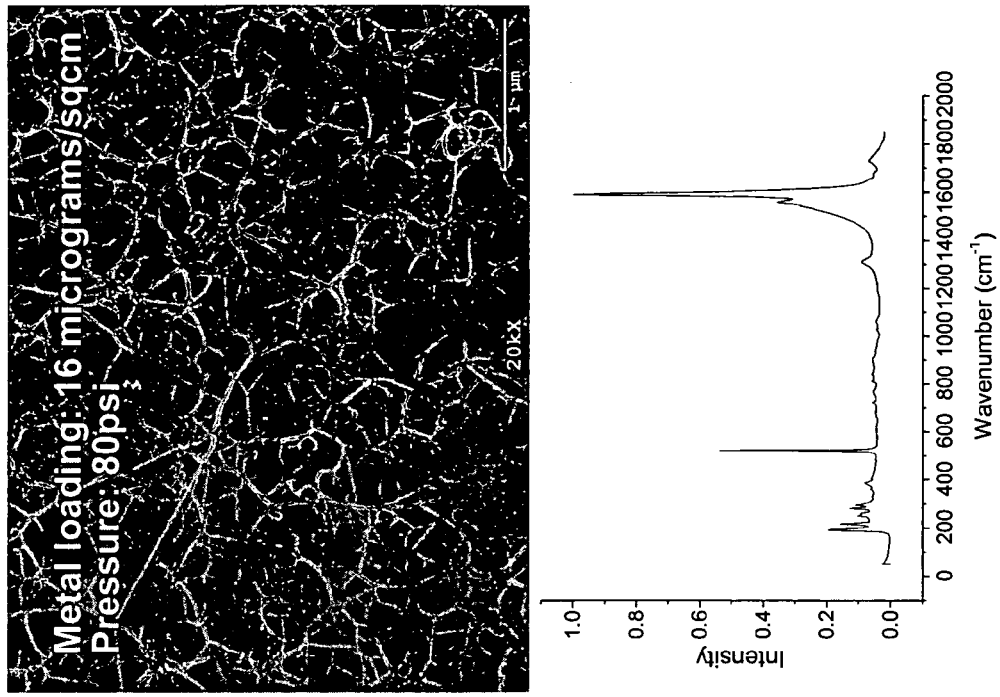
FIG. 2 shows (A) a micrograph of carbon nanotubes grown on a flat substrate, and (B) a Raman spectra of the carbon nanotubes of (A).

The present invention contemplates methods of producing CNT-bearing films, and preferably SWNT bearing-films, on flat surfaces (flat substrates) such as silicon wafers which have small amounts of catalytic metal, e.g., cobalt and molybdenum, disposed thereon.

The carbon nanotube-polymer film compositions produced herein can be used, for example as, electron field emitters, fillers of polymers in any product or material in which an electrically-conductive polymer film is useful or necessary for production. CNTs grown on flat surfaces can be removed from the flat surface by different means (including, but not limited to, peeling off as in the examples, shearing, sonication, and chemical etching of the flat surface) resulting in high purity CNTs that can be used for any CNT application. The flat surface-CNT material could also be used in applications such as sensors, interconnects, transistors, field emission devices, and other devices.

The flat substrates of the present invention include substrates having continuous (non-particulate) surfaces which may be completely flat (planar) or may have a curvature including convex and concave surfaces and surfaces which have one or more trenches therein. It may also exhibit some roughness, which is small relative to the macroscopic scale of the substrate.

Materials having flat surfaces contemplated for use as flat substrates or support material for the catalysts described herein, may include or may be constructed from (but are not limited to): wafers and sheets of $SiO_2$, Si, organometalic silica, p-or n-doped Si wafers with or without a $Si_2$ layer, $Si_3N_4$, $Al_2O_3$, MgO, quartz, glass, oxidized silicon surfaces, silicon carbide, ZnO, GaAs, GaP, GaN, Ge, and InP, sheets of metal such as iron, steel, stainless steel, and molybdenum and ceramics such as alumina, magnesia and titania.

The catalytic materials used in the present invention are prepared in one embodiment by depositing different metal solutions of specific concentrations upon the flat substrate (e.g., a silicon wafer). For example, Co/Mo catalysts can be prepared by impregnating various silicon wafers with aqueous solutions of cobalt nitrate and ammonium heptamolybdate (or molybdenum chloride) to obtain the bimetallic catalysts of the chosen compositions (see U.S. Pat. No. 6,333,016, the entirety of which is hereby expressly incorporated by reference herein). The total metal loading is preferably from 0.001 to 1000 mg/sq cm. After deposition of the metal, the catalytic flat substrates are preferably first dried in air at room temperature, then in an oven at 100° C.-120° C. for example, and finally calcined in flowing air at 400° C.-600° C.

Carbon nanotubes can be produced on these catalytic substrates in different reactors known in the art such as packed bed reactors, structured catalytic reactors, or moving bed reactors (e.g., having the catalytic substrates carried on a conveying mechanism such as in the systems described for example in more detail in Example 6).

The catalytic flat substrates may optionally be pre-reduced (e.g., by exposure to $H_2$ at 500° C. or, for example, at a temperature up to the reaction temperature) before the catalytic flat substrate is exposed to reaction conditions. Prior to exposure to a carbon containing gas (e.g., CO), the catalytic flat substrate is heated in an inert gas (e.g., He) up to the reaction temperature (600° C.-1050° C.). Subsequently, a carbon-containing gas (e.g., CO) or gasified liquid (e.g., ethanol) is introduced. After a given reaction period ranging preferably from 1 to 600 min, the catalytic flat substrate having CNTs thereon is cooled down to a lower temperature such as room temperature.

For a continuous or semi-continuous system, the pretreatment of the catalytic flat substrate may be done in a separate reactor, for example, for pretreatment of much larger amounts of catalytic flat substrate whereby the catalytic flat substrate can be stored for later use in the carbon nanotube production unit.

In one embodiment of the invention, the catalytic flat substrate selectively produces SWNTs by the disproportionation of CO (decomposition into C and $CO_2$) in a preferred temperature range of 700-950° C. (see U.S. Ser. No. 10/118,834, which is hereby expressly incorporated by reference herein in its entirety).

The catalytic precursor solutions used for applying catalytic coatings to the flat substrates of the present invention preferably comprise at least one metal from Group VIII, Group VIb, Group Vb, or rhenium or mixtures having at least two metals therefrom. Alternatively, the catalytic precursor solutions may comprise rhenium (Re) and at least one Group VIII metal such as Co, Ni, Ru, Rh, Pd, Ir, Fe and/or Pt. The Re/Group VIII catalyst may further comprise a Group VIb metal such as Cr, W, or Mo, and/or a Group Vb metal, such as Nb. Preferably the catalytic precursor solutions comprise a Group VIII metal and a Group VIb metal, for example, Co and Mo.

Where used herein, the phrase "an effective amount of a carbon-containing gas" means a gaseous carbon species (which may have been liquid before heating to the reaction temperature) present in sufficient amounts to result in deposition of carbon on the catalytic flat surfaces at elevated temperatures, such as those described herein, resulting in formation of CNTs thereon.

As noted elsewhere herein, the catalytic flat substrates as described herein include a catalytic metal composition deposited upon a flat support material.

The ratio of the Group VIII metal to the Group VIb metal and/or Re and/or Group Vb metal in the catalytic materials may affect the yield, and/or the selective production of SWNTs as noted elsewhere herein. The molar ratio of the Co (or other Group VIII metal) to the Group VIb or other metal is preferably from about 1:20 to about 20:1; more preferably about 1:10 to about 10:1; still more preferably from 1:5 to about 5:1; and further including 1:9, 1:8, 1:7, 1:6, 1:5, 1:4, 1:3, 1:2, 1:1, 2:1, 3:1, 4:1, 5:1, 6:1, 7:1, 8:1, and 9:1, and ratios inclusive therein. Generally, the concentration of the Re metal, where present, exceeds the concentration of the Group VIII metal (e.g., Co) in catalytic precursor solutions and catalytic compositions employed for the selective production of SWNTs.

The catalytic precursor solution is preferably deposited on a flat support material (substrate) such as a silicon wafer as noted above or other flat materials known in the art and other supports as described herein as long as the materials have a flat surface, as described herein. Preferably, the catalytic precursor solution is applied in the form of a liquid precursor (catalyst solution) over the flat substrate.

Examples of suitable carbon-containing gases and gasified liquids which may be used herein include aliphatic hydrocarbons, both saturated and unsaturated, such as methane, ethane, propane, butane, hexane, ethylene, and propylene; carbon monoxide; oxygenated hydrocarbons such as ketones, aldehydes, and alcohols including ethanol and methanol; aromatic hydrocarbons such as toluene, benzene and naphthalene; and mixtures of the above, for example carbon monoxide and methane. The carbon-containing gas may optionally be mixed with a diluent gas such as helium, argon or hydrogen or gasified liquid such as water vapor.

The preferred reaction temperature for use with the catalyst is between about 600° C. and 1200° C.; more preferably between about 650° C. and 1000° C.; and most preferably between 750° C. and 900° C.

In one embodiment, SWNTs may comprise at least 50% of the total CNT product produced on the catalytic flat substrates. Furthermore, SWNTs may comprise 60%, 65%, 70%, 75%, 80%, 85%, 90%, 95%, 97.5%, 98% or 99% of the total CNT product.

In an alternate embodiment, MWNTs may comprise at least 50% of the total CNT product. Furthermore, MWNTs may comprise 60%, 65%, 70%, 75%, 80%, 85%, 90%, 95%, 97.5%, 98% or 99% of the CNT product.

In an alternate embodiment, double-walled CNTs may comprise at least 50% of the total CNT product. Furthermore, double-walled CNTs may comprise 60%, 65%, 70%, 75%, 80%, 85%, 90%, 95%, 97.5%, 98% or 99% of the CNT product.

In other embodiments, the CNT product may comprise a mixture of SWNTs, double-walled CNTs, and MWNTs.

While the invention will now be described in connection with certain preferred embodiments in the following examples so that aspects thereof may be more fully understood and appreciated, it is not intended to limit the invention to these particular embodiments. On the contrary, it is intended to cover all alternatives, modifications and equivalents as may be included within the scope of the invention. Thus, the following examples, which include preferred embodiments will serve to illustrate the practice of this invention, it being understood that the particulars shown are by way of example and for purposes of illustrative discussion of preferred embodiments of the present invention only and are presented in the cause of providing what is believed to be the most useful and readily understood description of formulation procedures as well as of the principles and conceptual aspects of the invention.

EXAMPLE 1

Growth and Harvest of SWNTs (1) Catalytic Precursor Solution (to Prepare the Catalytic Composition)

Cobalt salt solution: dissolve 0.3100 g cobalt nitrate in a solvent such as isopropanol to make the total weight equal to 23.75 g., resulting in a Co concentration of 0.0442 mmol/g.

Molybdenum salt solution: add 1 g Dl (deionized) water to 0.9058 g molybdenum chloride under a hood, shaking well to make sure all the molybdenum chloride is dissolved to form a brown solution. Dilute the solution with a solvent such as isopropanol to 25 g resulting in a Mo concentration of 0.1326 mmol/g.

Mix the Co and Mo solutions in equivalent weight and add 5% of a wetting agent such as tetraethylorthosilicate or other solvent described below. Other catalytic metals may be used as indicated above, including those in Group VIII, Group VIb, Group Vb, and Re. Solvents which may be used to dissolve the catalytic metal components include, but are not limited to, methanol, ethanol, isopropanol, other alcohols, acetone, other organic solvents, acids, and water, depending on the solubility of the metal precursors and stability of the wetting agent.

Other wetting agents include, but are not limited to, silicates, silanes, and organosilanes, including polysiloxanes, polycarbosilanes, organosilazanes, polysilazanes, alkoxide-derived siloxanes, alkyl-cyclosiloxanes, alkyl-alkoxy-silanes, poly-alkyl-siloxanes, amino-alkyl-alkoxy-silanes, and alkyl-orthosilicates.

A catalyst stabilizer may be included and can be selected from the group including, but not limited to: silicates, silanes, and organosilanes including polysiloxanes, polycarbosilanes, organosilazanes, polysilazanes, alkoxide-derived siloxanes, alkyl-cyclosiloxanes, alkyl-alkoxy-silanes, poly-alkyl-siloxanes, amino-alkyl-alkoxy-silanes, or alkyl-orthosilicates, as well as organotitanates, such as titanium alkoxides or titanoxanes; organic aluminoxy compounds, organozirconates, and organomagnesium compounds (including Mg alkoxide).

The catalytic precursor solution (e.g., Co, Mo) can be prepared and used immediately, or prepared and stored for later use.

(2) Deposition of Catalytic P precursor Solution (e.g., Co/Mo) on Silicon Wafer (Flat Substrates)—DSD (Drop-Spread-Dry) Process.

The deposition process in this example comprised dropping a small amount of the catalytic precursor solution onto the flat substrate. The solution (coating) spread over the substrate to form a uniform layer on it and dried quickly forming the catalytic composition on the catalytic flat substrate.

Alternatively, the catalytic precursor solution may be applied to the substrate movable support system via spraying, coating, spin coating, dipping, screen printing, or other methods known in the art. Also, the drying process can be done slowly, by letting the flat substrate rest at room temperature and covered to keep a higher relative humidity and lower air circulation than in open air.

(3) Thermal Pretreatment of the Catalytic Flat Substrates

The Co/Mo silicon wafer (catalytic flat substrate) thus produced can be further dried in an oven at 100° C. for 10 min, then calcined in air at 500° C. (or 400° C.-600° C. for 15 min in a muffle.

The calcined catalytic flat substrate was placed in a 1 inch-diameter quartz reactor, parallel to the gas flow direction and reduced in 1,000 standard cc/min (sccm) of pure $H_2$ at 500° C., with a heating ramp from room temperature to 500° C. in 40 min and held at that temperature for 5 additional minutes. Then, the feed to the reactor was switched to pure He and temperature raised to 750° C. at a rate of 10° C./min. The calcination can be done immediately after drying or after leaving the dried catalytic flat substrate in storage for several days. The calcination temperature may vary from 300° C. to 650° C. and the calcination time from 1 to 30 min.

Alternatively, the reduction temperature can be varied between 400° C. to 850° C. and the reduction time from 1 to 30 min. The heating procedure can be either using a ramp from 1 to 100° C./min, or by introducing the sample on a preheated zone.

(4) Production of SWNTS on the Catalytic Flat Substrate.

a) The reduced catalytic flat substrate was exposed to a 1,000 sccm flow of pure CO at 750° C. The reaction lasted for 30 min under 15 psi of pure CO.

b) After reaction, the system was kept at the same temperature for 30 min under flow of He and finally cooled to room temperature under He.

The CO gas velocity can vary between 1 cm/min and 10 m/min (standard conditions); with flow regimes from laminar to turbulent. The flow patterns can be altered by use of baffles or trenches. Alternatively, the feed could be selected from methane, ethane, ethylene, ethanol, or other materials as described elsewhere herein. Also, co-feeding gases such as water, oxygen, or hydrogen can be employed.

(5) Transfer of SWNTs from the Catalytic Flat Substrate to Another Medium a) After step 4, a mixture of polydimethylsiloxane (PDMS) pre-polymer (Sylgard-184) and a cross-linking agent was deposited on the surface of SWNT/catalytic flat substrate. The weight ratio of PDMS to crosslinking agent was 10:1.

b) The wafer (i.e., the SWNT/catalytic flat substrate) with polymer film was then sent to an oven to cure for 2 h at 60° C. After cooling down, the resulting polymer film containing the SWNTs, was peeled off the silicon wafer (catalytic flat substrate). Raman characterization on both the Si wafer surface and the polymer surface indicated that the transfer of SWNTs into the polymer was practically (substantially) complete.

Examples of polymers which may be applied to the catalytic flat substrate having SWNTs thereon include, but are not limited to: polypropylene, polyethylene, polyacrylamide, polycarbonate, polyethylene terephthalate (PET), polyvinylchloride, polystyrene, polyurethane, Teflon, Saran, polyacrylonitrile, polyvinylacetate, polyvinylalcohol, polymethyl methacrylate (PMMA), polyacrylates, polyguargum, polyesters, and polyamides such as nylon, as well as polymers formed in situ for example by crosslinking pre-polymers applied to the nanotube-bearing catalytic flat substrate (e.g., as shown in the example).

Similarly, the transferring medium could be a metal instead of a polymer. In this case, a metal film could be applied over the CNTs by different methods, such as sputtering or evaporation. The metal film could subsequently be welded to another metal to make electrical contacts, change surface properties, change heat conduction, and fluid dynamic properties, for example.

The transfer of CNTs from the catalytic flat substrate to the transferring medium can adopt two possible configurations. In the first, the SWNTs are completely embedded in the matrix applied to the catalytic flat substrate and in the second, the transferring medium only covers a fraction of the CNT structure and after the transfer, part of the CNTs remain exposed. The schematic shown below illustrates a brush-like structure. However, the concept is not limited to this particular structure, but applies to any other in which a portion of the CNTs remains exposed.

EXAMPLE 2

(A) Growth of SWNTs on Catalytic Flat Substrates Forming Two-Dimensional Arrays

Effects of Gas Pressure on SWNT Density on the Catalytic Flat Substrate.

SWNTs were grown on the Co-Mo/Si wafer surface for 30 min at 750° C., under different CO pressures. The catalytic flat substrates (wafers) were prepared following the recipe described in Example 1.

Figure 1:
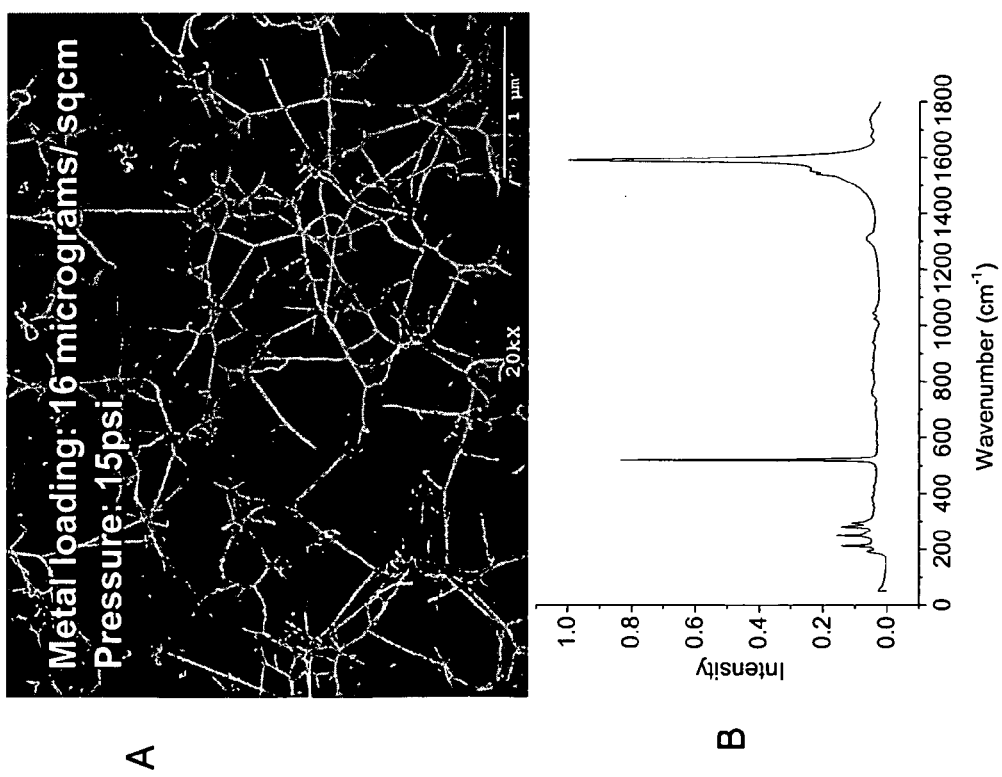
FIG. 1 shows (A) a micrograph of carbon nanotubes grown on a flat substrate, and (B) a Raman spectra of the carbon nanotubes of (A).

The resulting CNT structures, as observed by scanning electron microscopy (SEM) are illustrated in FIGS. 1 and 2. FIG. 1A shows growth of SWNTs at a lower pressure (15 psig) and shows a lower density of SWNTs than in FIG. 2A, which showed a higher SWNT density obtained at higher pressure (80 psig). The corresponding Raman spectra (FIGS. 1B and 2B) give clear evidence for the presence of SWNTs; that is, strong breathing mode bands (at 200-300cm$^{-1}$), characteristic of SWNT), sharp G bands (1590 cm$^{-1}$) characteristic of ordered carbon in sp2 configuration, and low D bands (1350 cm$^{-1}$), characteristic of disordered carbon in sp3 configuration.

(B) Effects of Co/Mo Concentration on SWNT Density on the Catalytic Flat Substrate SWNTs were grown for 30 min under CO (P=15 psig) at 750° C. over two surfaces having different loadings of Co/Mo catalytic metal.

In FIG. 1, the Co/Mo metal loading on the Si wafer was 16 mg/sq cm. The SWNTs grown thereon had a low density as shown in FIG. 1A.

Figure 3:
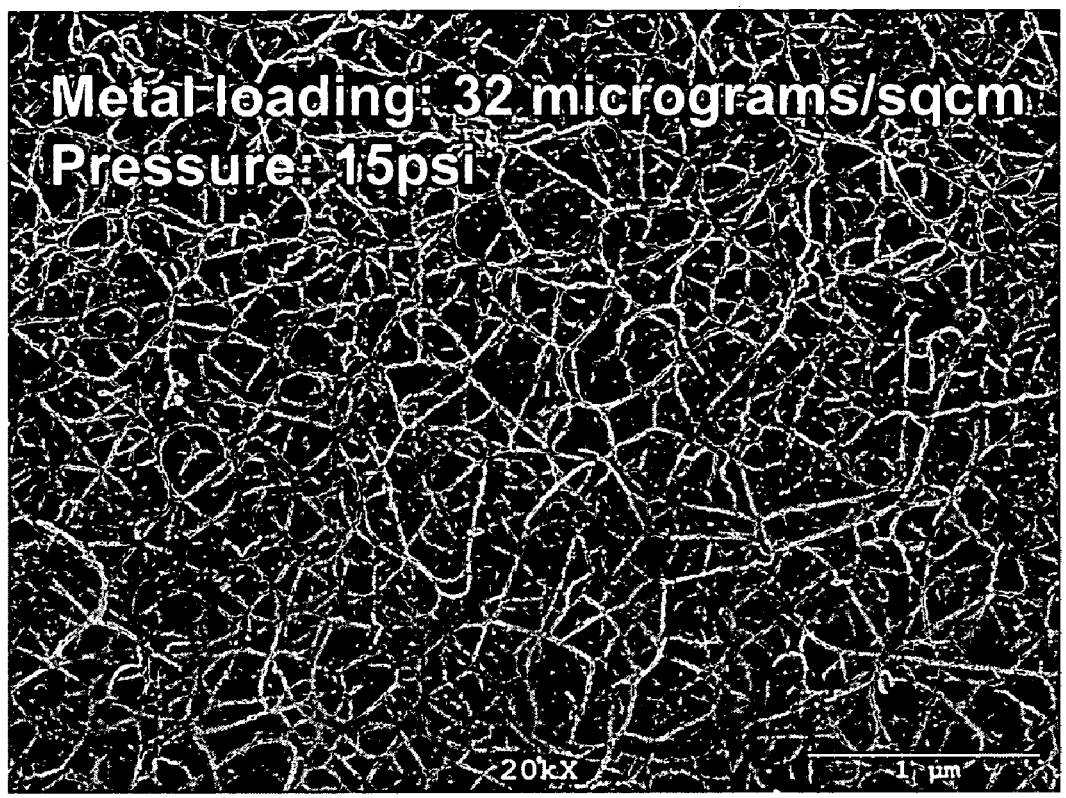
FIG. 3 shows (A) a micrograph of carbon nanotubes grown on a flat substrate, and (B) a Raman spectra of the carbon nanotubes of (A).
Figure 3:
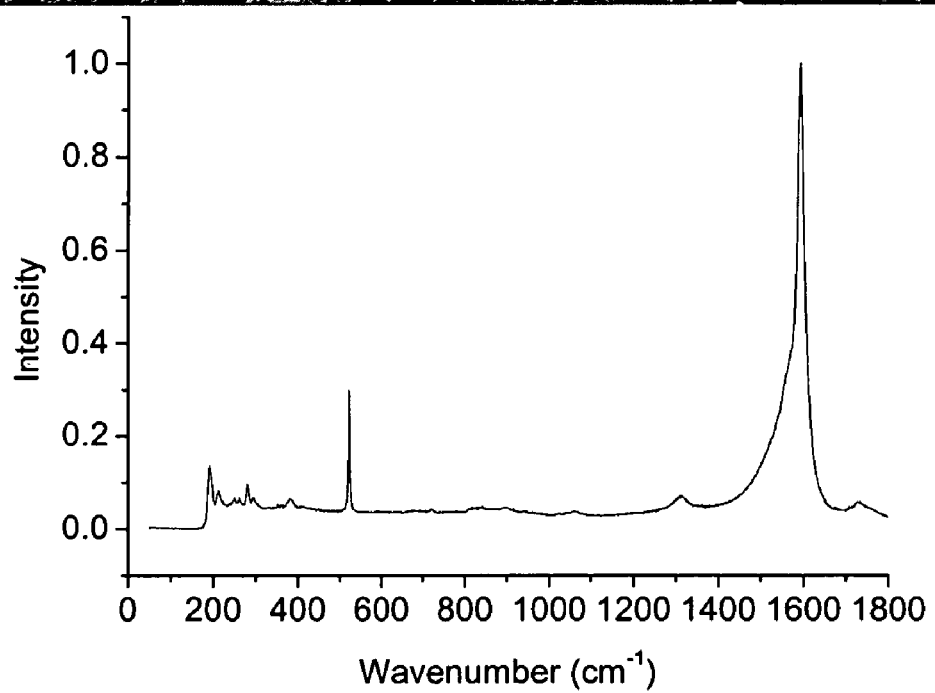

In FIG. 3, the Co/Mo metal loading on the Si wafer was 32 mg/sq cm. The SWNTs grown thereon had a high density as shown in FIG. 3A.

As for the results in (A), Raman analysis (FIGS. 1B and 3B) clearly shows the presence of SWNTs, with strong breathing mode bands (at 200-300cm$^{-1}$), characteristic of SWNTs, a sharp G band (1590 cm$^{-1}$) characteristic of ordered carbon, and a low D band (1350 cm$^{-1}$), characteristic of disordered carbon.

EXAMPLE 3

(A) Transfer of SWNTs from the Catalytic Flat Substrate onto a Transfer Medium

Figure 4:
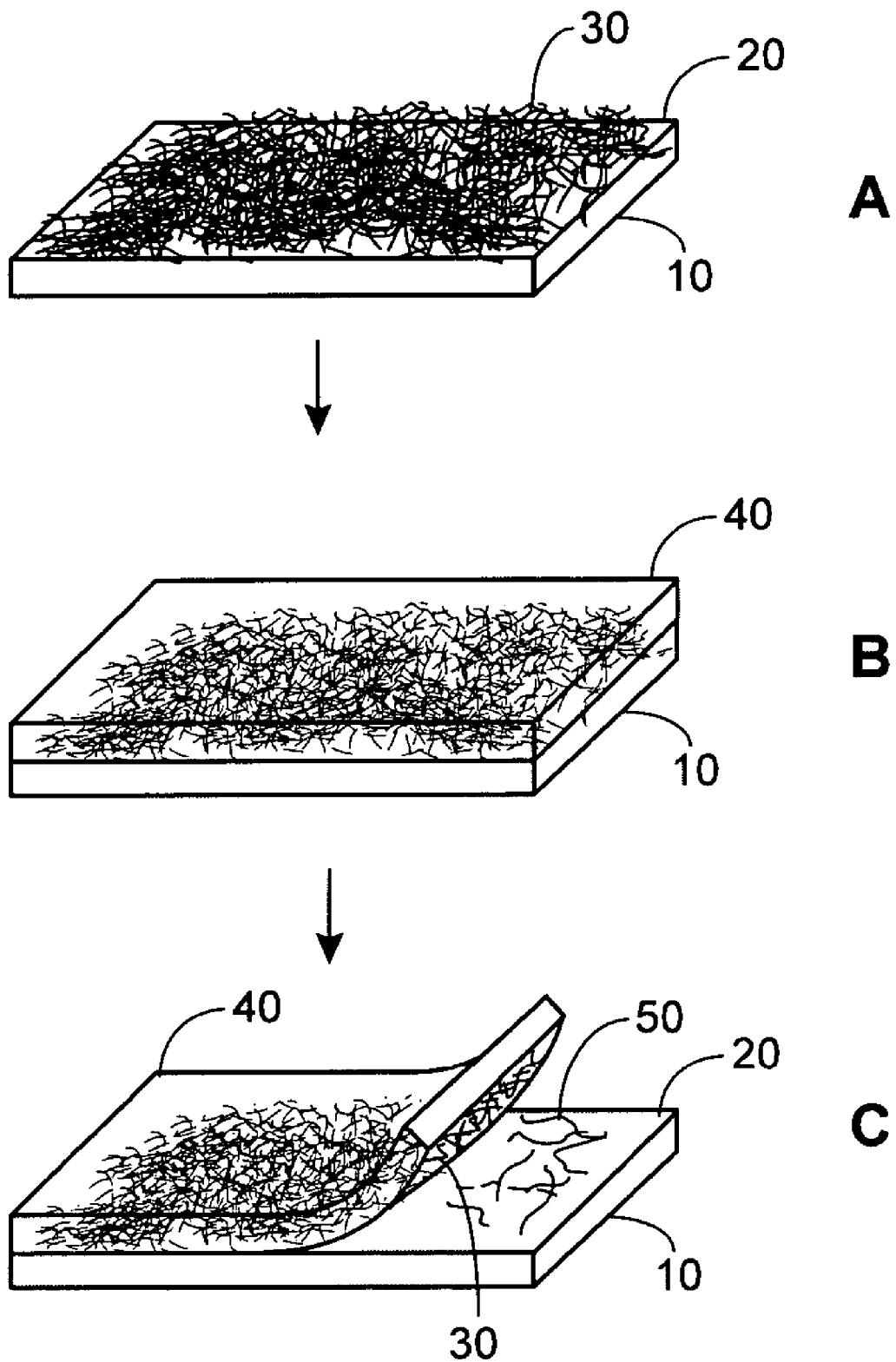
FIG. 4 is a schematic drawing showing the steps (A, B, C) of polymer transfer of nanotubes from a flat surface.

In one embodiment of the invention, after the SWNTs are formed on the catalytic flat substrate having the catalytic material thereon, they are transferred to a transfer medium comprising a polymeric film or other material (e.g., metal, ceramic, disordered film, elastomer, or carbon) deposited onto the catalytic flat substrate bearing the SWNTs (see Example 1, Step 5). The transfer medium may have an adhesive material thereon for enhancing adherence of the SWNTs thereto. A schematic representation of the transfer process is shown in FIG. 4. FIG. 4A shows a flat substrate 10 having a catalytic surface 20 thereon, and a SWNT mass 30 present on the catalytic surface 20. A transfer medium 40, (e.g., a polymeric material) is applied to the catalytic surface 20 of the flat substrate 10 and upon the SWNT mass 30 (FIG. 4B), wherein the transfer medium 40 is allowed to cure (if necessary), thereby causing transfer and adherence or entrapment of the majority of the SWNT mass 30 thereto. The transfer medium 40 and the SWNT mass 30 transferred thereto can be removed from the catalytic surface 20 (FIG. 4C). There is a residual mass 50 of SWNTs left on the catalytic surface 20 after the majority of the SWNT mass 30 is removed therefrom.

Figure 5:
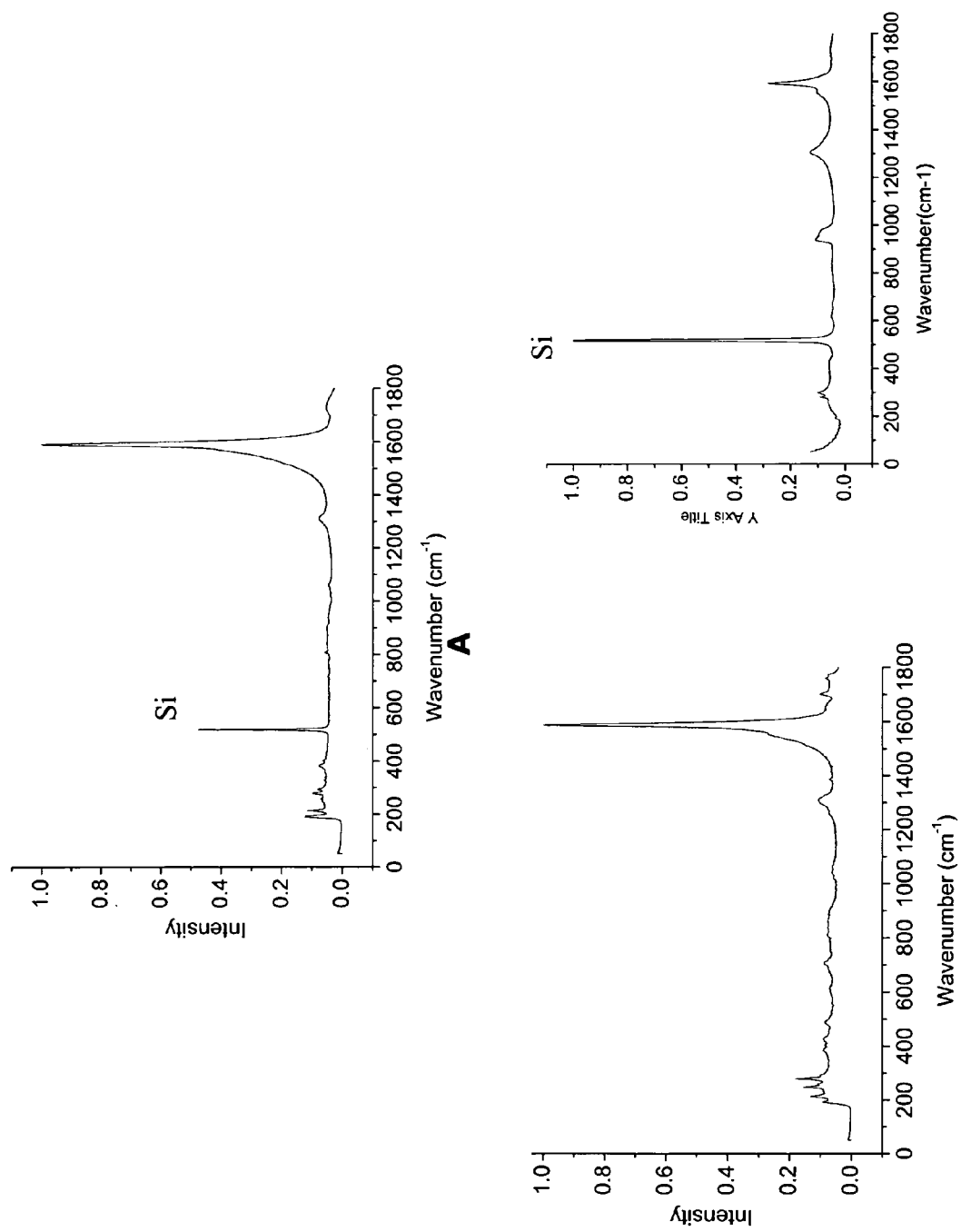
FIG. 5 shows Raman spectra of nanotubes at three stages of polymer transfer of nanotubes from a flat surface.

(B) Characterization of Si Wafer and Polymer Surfaces Demonstrating the Transfer FIGS. 5A-5C illustrate the different stages with the corresponding Raman spectrum obtained after the SWNT mass is transferred. FIG. 5A shows Raman spectra of the SWNT mass 30 before transfer. This spectrum shows the clear fingerprint of SWNT of high quality; that is, a strong G band, a weak D band and clear breathing mode bands. FIG. 5B shows a Raman spectrum of the SWNTs on the polymer material 40 after forming a film over the SWNT-containing Si wafer and peeling off. The Raman spectrum shows that a large fraction of the SWNT mass 30 has been transferred onto the polymer material 40. All the features characteristic of SWNTs are clearly seen on the polymer material 40. FIG. 5C shows a Raman spectrum of a small residue of SWNTs left on the catalytic surface 20. As an internal calibration of the amount of SWNT on the surface of the Si wafer, one can note the relative intensities of the Si band and that of carbon (e.g. G band at 1590 cm$^{-1}$).

EXAMPLE 4

(A) Influence of Catalyst Loading on the Morphology of SWNT Formations

Production of Vertically Oriented SWNTs on Flat Si Substrate.

Following the preparation procedures described in Example 1, catalytic precursor solutions of varying metal concentration (0.001-3.8 wt %) were prepared by dissolving salts of Co and Mo into isopropanol, while keeping a constant Co:Mo molar ratio of 1:3. The subsequent steps were identical to those in Example 1. The as-produced SWNT over the flat substrate were characterized by Raman spectroscopy, electron microscopy (SEM and TEM), and probe microscopy (e.g., AFM).

Figure 6:
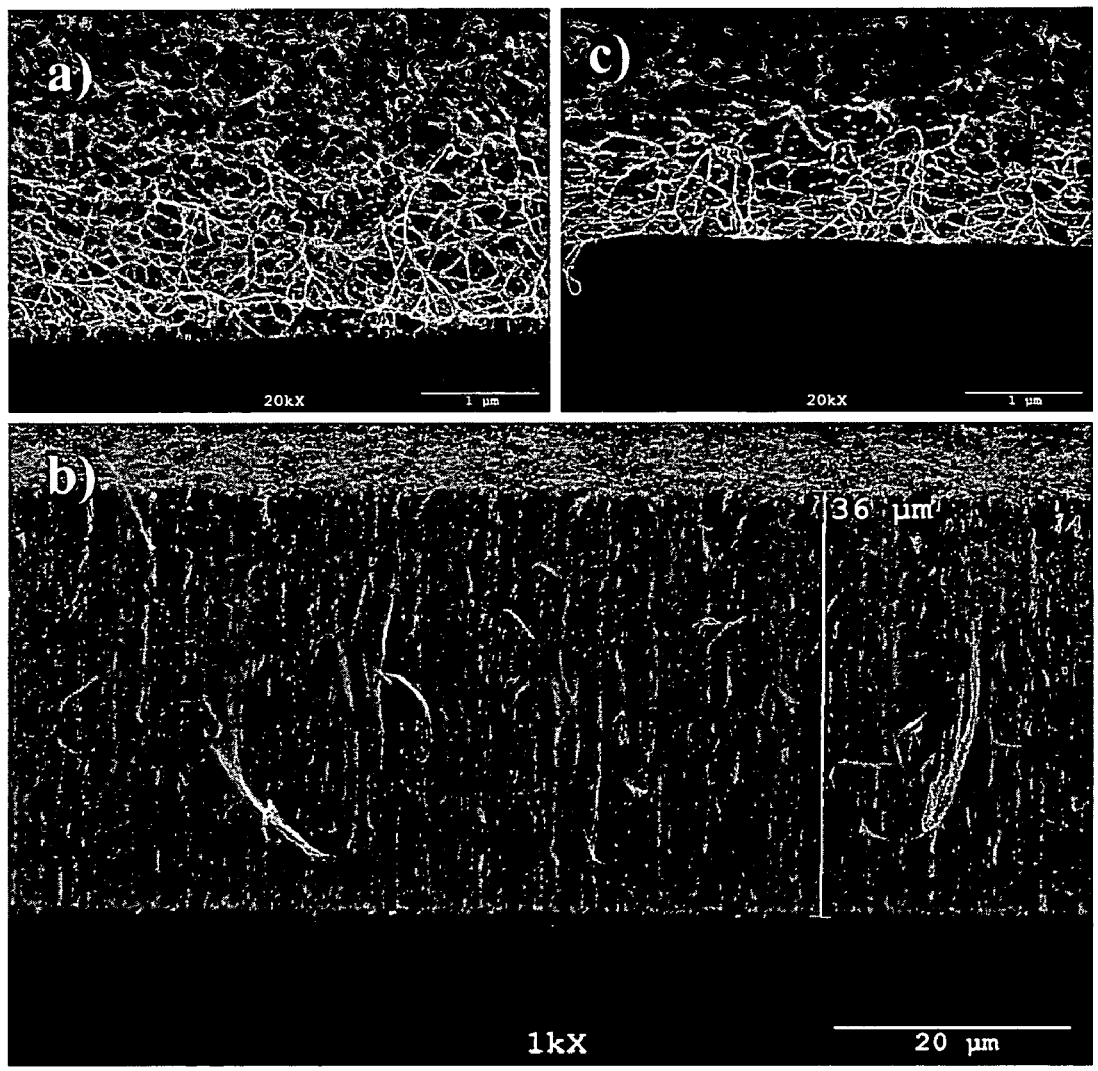
FIG. 6 shows SEM images of SWNTs produced on silicon wafers with catalyst solution of different concentrations: (a) 0.38, (b) 0.19%, (c) 0.02%. Concentration is in total metal weight. These loadings correspond to metal areal loadings of (a) 16 micrograms/cm$^2$, (b) 8 micrograms/cm$^2$, and © 0.8 micrograms/cm$^2$.

FIG. 6A-C illustrates the dramatic effect of catalyst loading on the resulting morphology of the SWNT formations. This reproducible trend undoubtedly demonstrates that the concentration of the catalyst solution affects the type of SWNT growth on the flat substrate. The SEM images clearly show that vertically aligned SWNTs (V-SWNT forest) almost 40 micron in length were grown on the substrate impregnated with catalytic precursor solution of 0.19 wt % total metal (Co-Mo) concentration (FIG. 6B). By contrast, on wafers impregnated with catalytic precursor solutions of 0.38 wt % (FIG. 6A) and 0.02 wt % (FIG. 6C), random two-dimensional networks of SWNT (grass) were observed after reaction. The sample with higher metal concentration (0.38 wt %) produced a higher nanotube density than the one with lower metal concentration (0.02 wt %), but neither of them resulted in vertical growth under the conditions used in this example. The results indicate that there is an optimum surface concentration of metals that results in vertical growth. Further, it was observed that "SWNT grass" grown with catalytic precursor solution of the higher concentration (0.38 wt %) was reasonably denser than that with catalytic precursor solution of lower concentration (0.02 wt %). Other concentrations having higher (up to 3.8 wt %) or lower (0.001 wt %) loadings were studied, but none of them produced vertically aligned SWNTs. In fact, the very high concentration (3.8 wt %) resulted in the formation of carbon fibers and multi-walled carbon nanotubes, while the lowest concentration of catalyst (0.001 wt %) produced mostly scattered thin bundles of SWNTs.

(B) Structural Analysis

Figure 7:
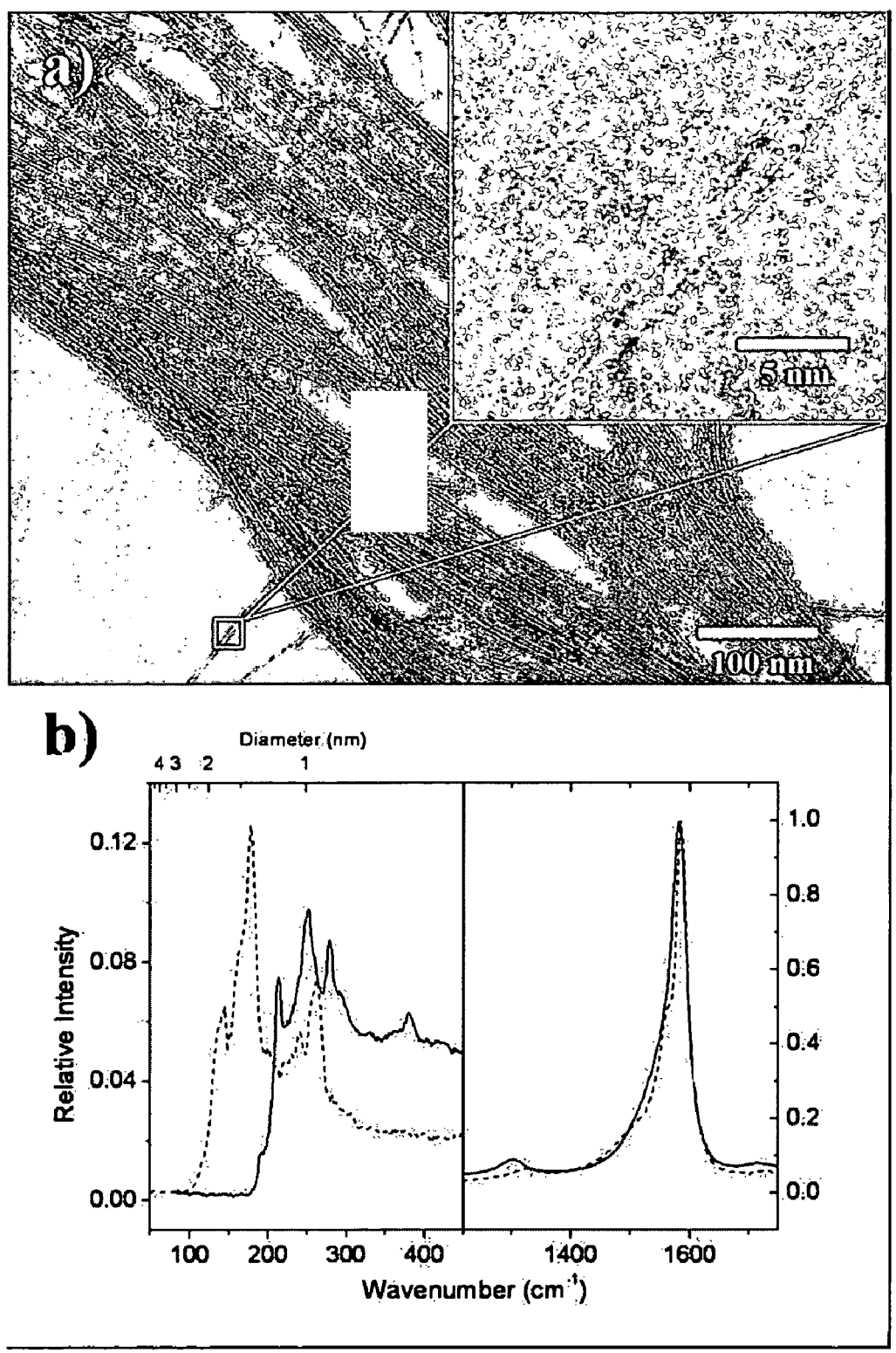
FIG. 7 shows structural characterization of VSWNTs: (a) TEM images of VSWNT material removed off the silicon wafer without any purification. (b) Raman spectra of as-produced VSWNTs with excitation lasers of wavelengths 633 nm (solid line) and 488 nm (dashed line).

The structural characteristics of the nanotubes that make up the "forest" and "grass" formations observed by SEM were further evaluated by Raman spectroscopy and TEM (FIG. 7). Raman spectroscopy is a well-known method for assessing the SWNT quality based on the relative intensity of the D and G bands. TEM provides a direct identification of the nature of the carbon species deposited on the surface (i.e., SWNTs, MWNTs, amorphous or nanofibers). Raman spectra (as shown in FIG. 7B) of the as-produced V-SWNT forest were obtained with two excitation lasers (633 nm and 488 nm). The very low D/G ratio is consistent with SWNTs of high quality with a low concentration of defective nanotubes or disordered carbon species (e.g., nanofibers). At the same time, it is well known that the frequency of the radial breathing mode bands (RBM) is inversely proportional to the nanotube diameter, according to the expression $\omega_{RBM}=234/d_{SWNT}+10$ [cm$^{-1}$]. The spectra for the V-SWNT sample obtained with three different lasers showed that the RBM brands cover a wide frequency range (from 130 cm$^{-1}$ to 300 cm$^{-1}$), which corresponds to a diameter range 0.8-1.9 nm, a distribution much broader than that typically obtained by the method of using Co-Mo catalysts supported on high-surface area silica. The broad distribution of diameters is also reflected in the convergence of the G$^-$ and G$^+$ features and broad base of the G band, in contrast with the sharper lines and more pronounced separation of the G$^-$ and G$^+$ contributions for the G band in the CoMoCAT material. The TEM observations of the V-SWNTs directly taken from the substrate without any purification indicated the presence of nanotubes of varying diameters (FIG. 7A) in agreement with the Raman spectra (FIG. 7B). At the same time, TEM gives ample evidence of the purity of the as-prepared V-SWNTs, free of other forms of carbon.

Figure 8:
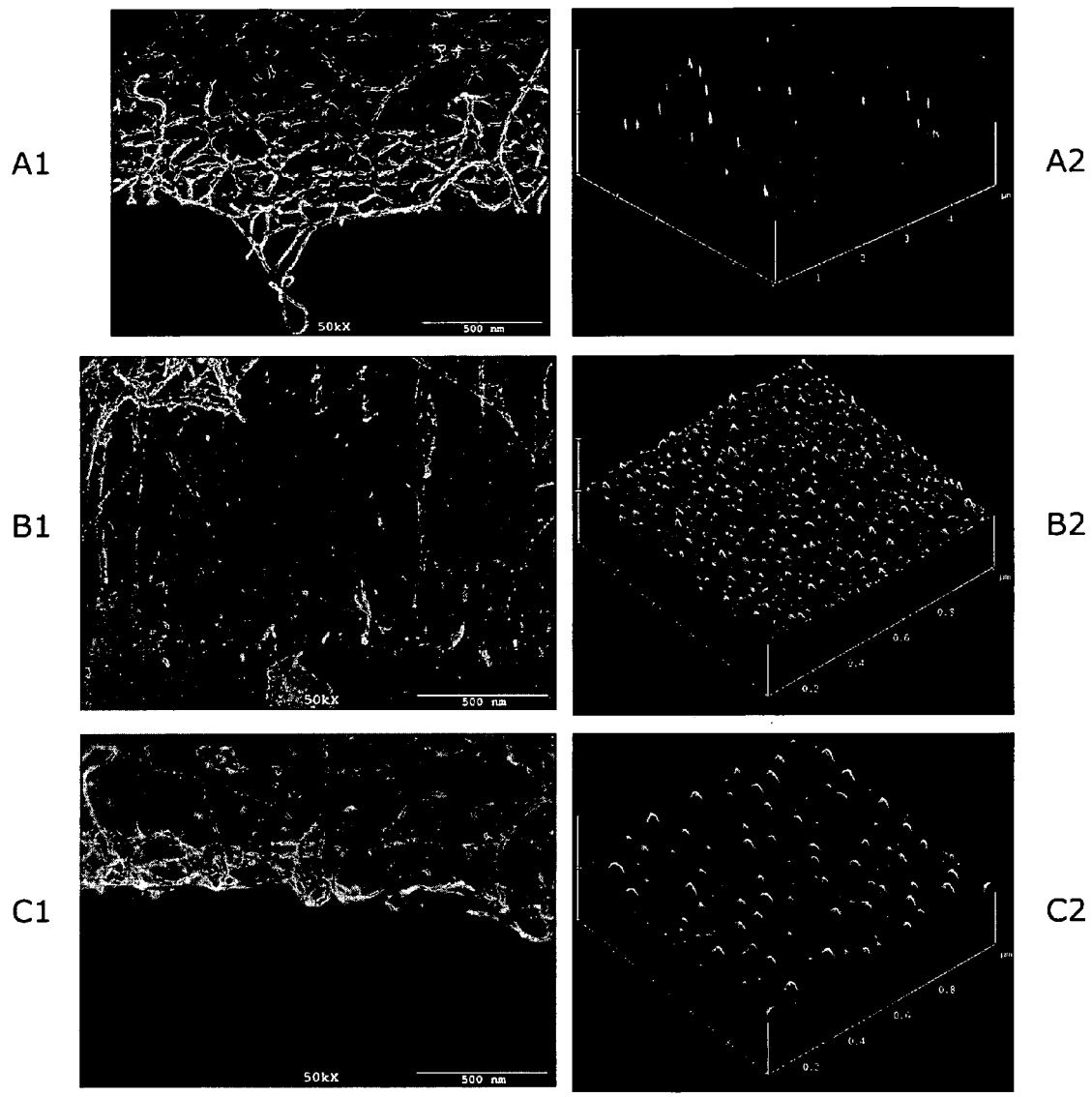
FIG. 8 shows side-by-side comparison of SEM pictures (left column) of SWNTs with AFM images (right column) of corresponding silicon wafers with catalyst solution of different concentrations: (a) 0.02% wt, (b) 0.19% wt, (c) 0.38% wt. Concentration (% wt) refers to total metal weight. AFM images were obtained after the silicon wafers were calcined in oven at 500° C. All the scale bars in SEM images are 500 nm and the widths of the AFM 3-D squares are 1 µm except the one in panel a2, which is 5 µm.

To explore the relationship between the metal loading on the flat substrate and the resulting morphology of the SWNT formations, we employed atomic force microscopy (AFM), a powerful tool that provides 3-dimensional profiles of surfaces. By investigating the morphology of the catalyst surface before the growth of nanotubes, we were able to identify the optimum distribution of particles that result in V-SWNT forest. This analysis is illustrated in FIG. 8 that contrasts high-magnification SEM pictures of the SWNT formations and AFM images of calcined catalyst/substrates for three different metal loadings. The AFM image in FIG. 8a1 clearly shows that the catalyst particles generated from the impregnating solution with the low metal concentration (0.02 wt %) were small and sparse. From this metal distribution, a similarly sparse formation of 2-dimensional SWNT grass was obtained (FIG. 8a2). In the case of intermediate metal concentration (0.19 wt %), the AFM in FIG. 8b1 evidences a dense population of nano-particles with relatively uniform size. The average distance between these particles was around 60-70 nm. It must be noted that TEM/EDXA analysis, as well s angle-resolved XPS analysis, showed that not all the Co and Mo added remained exposed on the surface. Rather, a fraction of them became buried in the layer of silica product that results from the decomposition of the catalyst stabilizer and wetting agent during the thermal treatment. The SEM image of FIG. 8b2 shows that this distribution is successful in promoting the formation of V-SWNT forest. Interestingly, the density of nanotubes bundles is approximately the same as the density of catalyst particles observed by AFM before the growth, which suggest that essentially every catalyst particle is active for the production of nanotubes. By contrast, in the case of 0.38% wt metal concentration as shown in FIG. 8c2, some bigger alloy particles formed on the flat surface and possibly generated larger cobalt clusters which are not suitable for SWNT nucleation, while a small fraction of Co clusters with the optimum size to grow SWNT still remained between large ones. Thus, a thicker layer of SWNT grass was grown as shown in FIG. 8c1.

Figure 9:
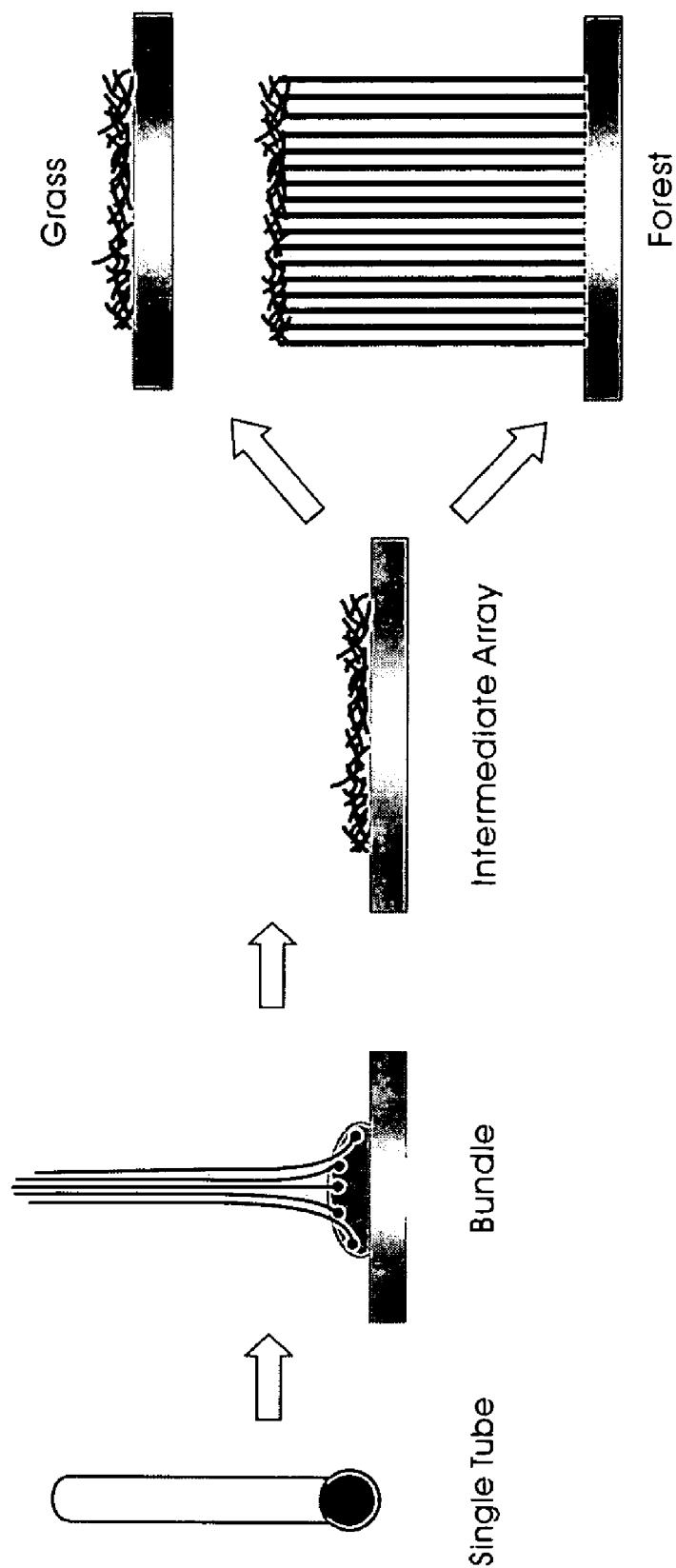
FIG. 9 shows schematic diagram illustrating the proposed growth mechanism of 3-order structures of V-SWNTs: from left to right is $1^{st}$-order structure of a single tube, $2^{nd}$-order structure of a bundle, and $3^{rd}$-order structure, which can be 2D (xy) grass or 1D (z) forest.

In another observation of considerable note, it is observed that the carbon deposits of a V-SWNT are observed directly perpendicular to the surface, a random network of SWNT bundles is clearly evident over the top of the forest, while the observation at different angles clearly shows the well-aligned structure shown in FIG. 8b1. There is no doubt that, in this case, the root-growth mechanism is operative. Therefore, the nanotube fraction that is observed on top of the forest has been formed during the first stages of reaction, while the ordered (vertically-oriented) growth only occurs later, seemingly constrained by the presence of the 2-dimensional crust formed in the initial stages. Initially, a layer of randomly arranged SWNT grows from a loose network to a dense network (see FIG. 9). The density of this network depends on the surface concentration of catalyst. With a low concentration of catalyst only a rather loose structure is formed. By contrast, in a region with the proper catalyst density a dense nanotube array forms a crust (a horizontal layer of randomly-oriented carbon nanotubes) that constitutes a rather solid structure. This crust is later lifted up by the growing nanotubes from the bottom (see FIG. 8b1). This is the reason why, while each individual nanotube is not perfectly straight and not necessarily every nanotube has the same length, the overall forest has a smooth top surface.

EXAMPLE 5

Production of Patterns of Vertically Oriented SWNT on Flat Substrate

To further demonstrate the effect of the distribution of catalyst particles on the growth of SWNT on flat substrates, in addition to the uniform nanotube growth on uniform catalyst films described in Example 4, patterned nanotube films were prepared by two different methods. In one of the methods, the patterns occurred naturally and in the other, the patterning was controlled. Natural patterns were formed when a wet catalyst thin film was dried at a fast drying rate. This method resulted in separate circular droplets of catalysts distributed over the Si substrate. By contrast, the controlled patterning was done by using a mask and sputtering a film of Au-Pd on a previously formed homogeneous catalyst film, prepared by slow drying and calcined in air. In this way, the fraction of catalyst covered by the Au-Pd alloy was selectively deactivated and no nanotube growth occurred on those regions. As a result, the nanotube forest only grew from the remaining areas of active catalyst. The as-produced SWNT over the catalyst/wafer were characterized by Raman spectroscopy, electron microscopy (SEM and TEM), and probe microscopy (AFM).

Figure 10:
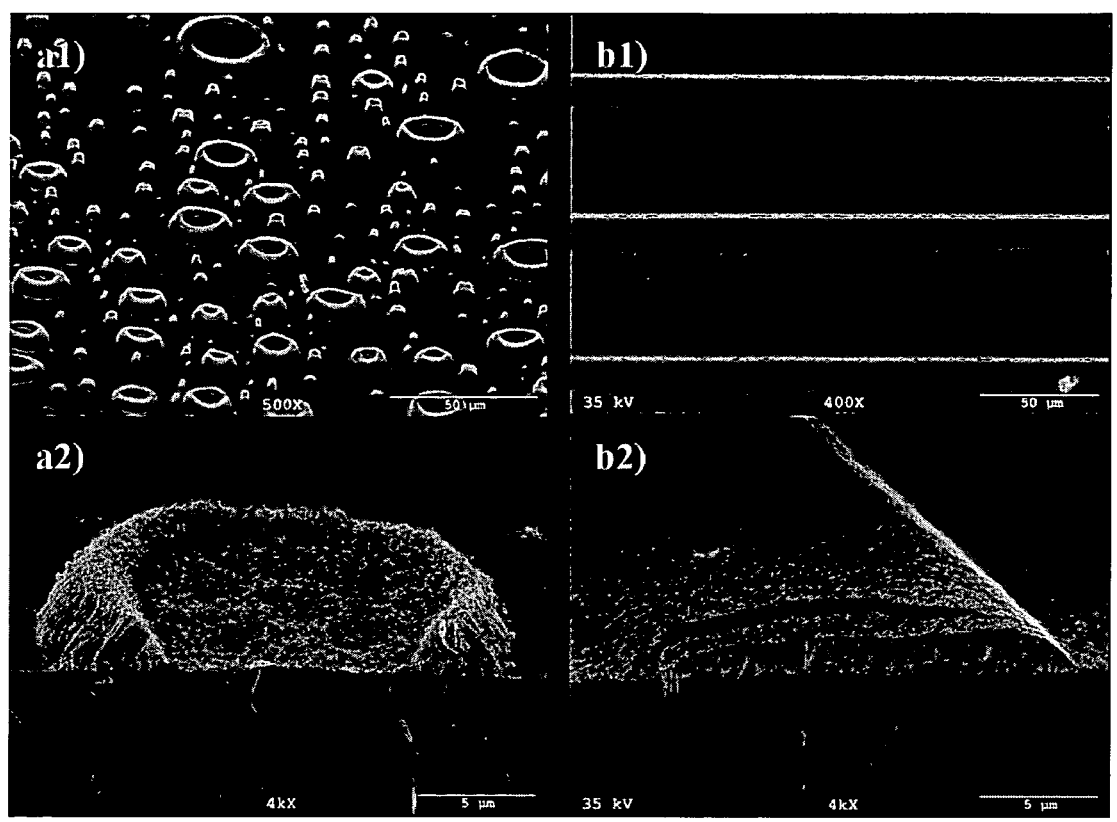
FIG. 10 shows SEM images of orderly arrays of SWNTs patterned by fast drying process (a) and grid-masked sputter coating (b). Images were taken with lower (1) and higher magnification (2).

In the case of the natural pattern, fast drying in the air resulted in microscopic circular areas with varying concentration of catalyst. For the manual process, a TEM grid was used as a mask to protect the previously deposited Co-Mo catalyst. The fraction of the surface that was not covered by the grid was deactivated by a film of Au/Pd sputtered over the surface. The resulting patterned growth of V-SWNT obtained by the two methods is illustrated in FIG. 10. FIG. 10a1 shows volcano-shaped SWNT arrays on the substrate patterned by fast drying method. A cross-sectional image of one of these volcanoes in higher magnification (FIG. 10A2) shows that they comprise vertically aligned SWNT near the edge of the ring, with 2-dimensional random arrangements ("grass") in the middle part. Image (FIG. 10a2) shows parallel V-SWNT bars grown on activated catalyst area defined by TEM grid. Due to diffusion of Au-Pd from the edge into the space between grid and surface, there is catalyst concentration gradient in the edge area. As a result, the forest in this area bends towards the outside with the crust on the top extending continuously to the grass attached to substrate.

EXAMPLE 6

System for Continuous Production of Carbon Nanotubes on Flat Substrates

Figure 11:
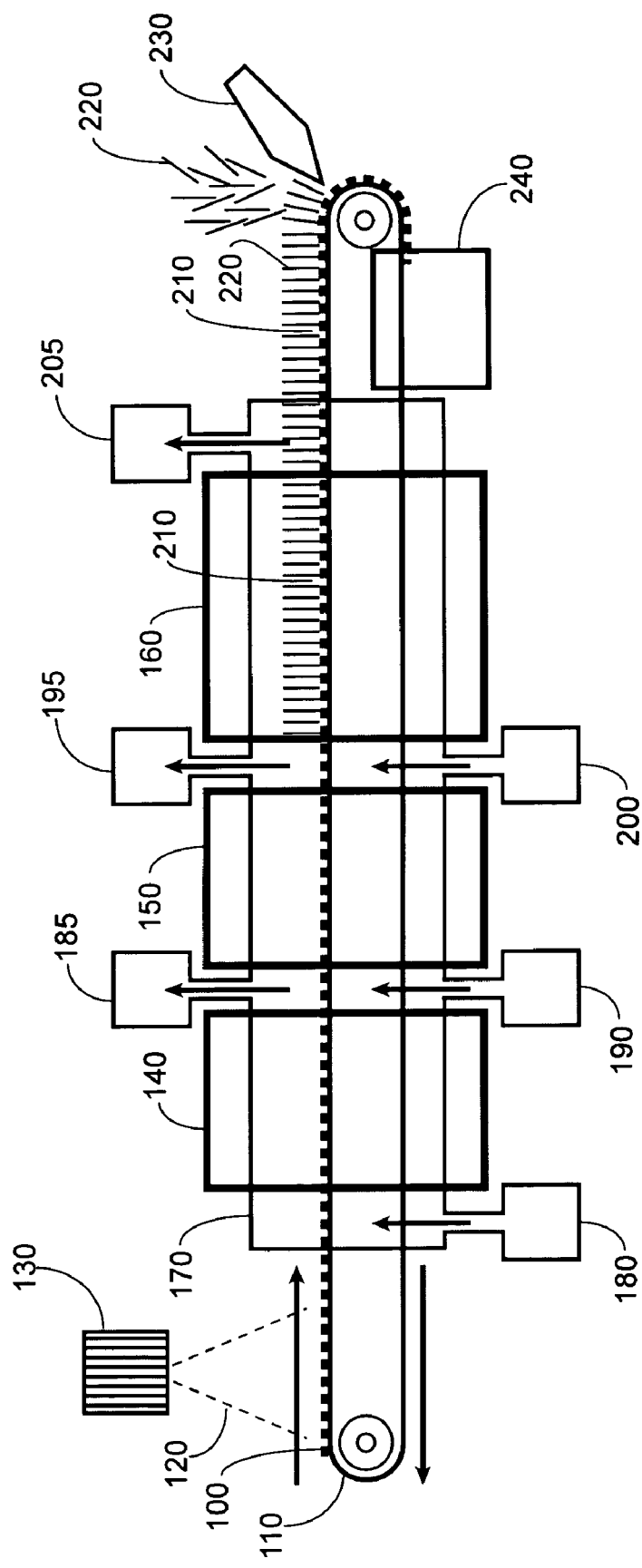
FIG. 11 is a schematic representation of a continuous process of growing and harvesting carbon nanotubes from flat surfaces.
Figure 12:
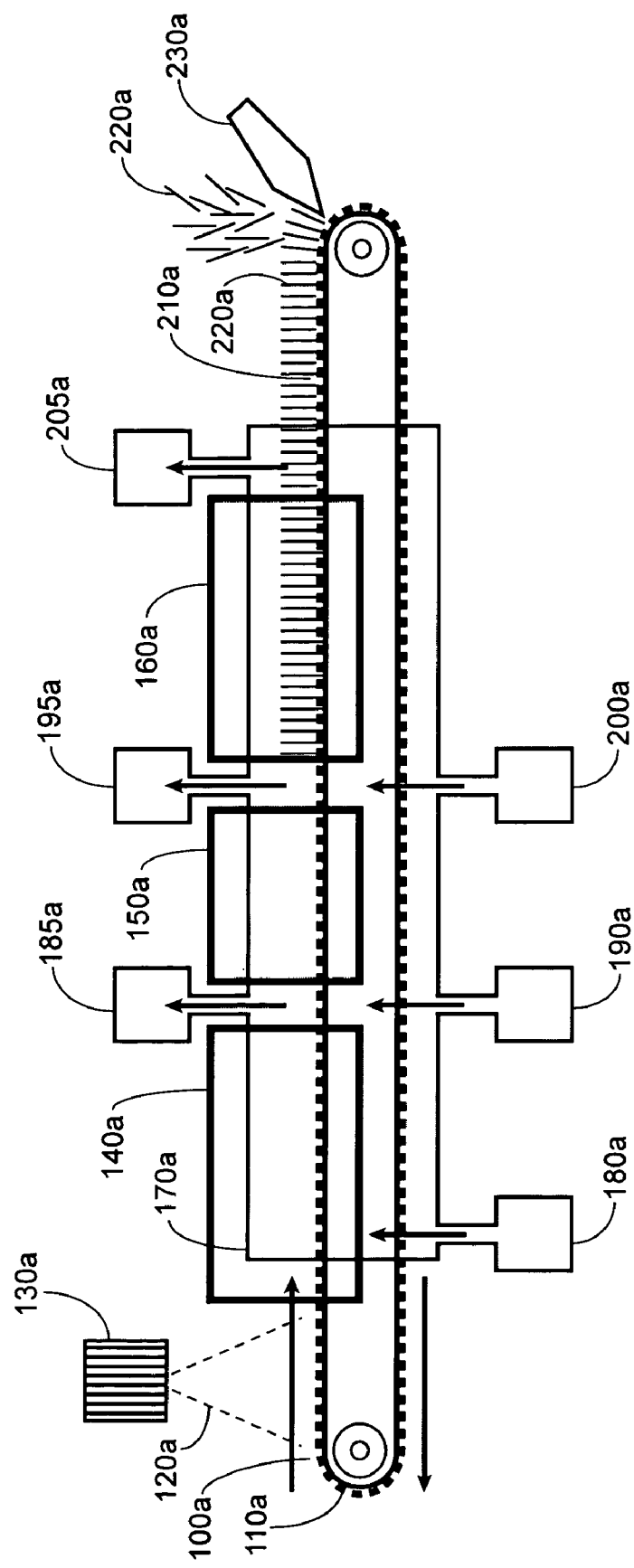
FIG. 12 is a schematic representation of an alternative continuous process of growing and harvesting carbon nanotubes from flat surfaces.

In an alternative embodiment, the SWNTs may be grown on flat substrates 100 (as defined elsewhere herein) in a continuous process, shown for example in FIGS. 11 and 12. The flat substrates 100 are applied to a conveying assembly 110 such as a conveyor belt which can move directionally in a continuous manner. A catalytic precursor solution 120 can be applied to the flat substrates 100 by a spraying mechanism 130 or by other application means including use of slot dies, rods, gravures, knife, over roll and reverse roll thereby forming catalytic flat substrates 100. As shown by example, furnaces 140, 150 and 160 can be positioned such that the conveyor assembly 110 can convey the catalytic flat substrates 100 into a reaction zone 170 for sequentially calcining and reducing the catalytic flat substrates 100 to make them more catalytically active then causing nanotube growth at varying temperatures. For example, at inlet 180, air may be input into the reaction zone 170 for calcining the catalytic flat substrates 100 in furnace 140, and H2 may be input at inlet 190 in the reaction zone 170 for reducing the calcined catalytic flat substrates 100 in furnace 150. A carbon containing gas such as CO or ethanol may then be input into the reaction zone 170 at inlet 200 for supplying the carbon-containing gas for the catalytic process of producing nanotubes in furnace 160. As SWNT-bearing catalytic flat substrates 210 leave the furnace 160 with SWNTs 220 thereon, the SWNTs 220 can be harvested therefrom for example by a blade 230 or other methods not shown, including but not limited to, passing the belt through a tank and using sonication to promote release of the tubes, subjecting the nanotube field to a shear field (gas or liquid) or contacting the nanotube coated belt/web/plate with a tacky material. Gases may be removed or recycled from the reaction zone 170 (to be reused or to have by-products removed therefrom) via outlets 185, 195 and 205 for example. The catalytic flat substrates 100 which have been harvested of SWNTs 220 can then be removed from the conveyor assembly 110, for example, by passing them through a recycling unit 240 or merely the catalytic composition 120 may be removed therefrom. New flat substrates 100 can then be applied to the conveyor assembly 110 or new catalytic precursor solution 120 may be applied to flat substrates 100 which remain on the conveyor assembly 110.

Alternatively the SWNT-bearing catalytic flat substrates 210 could be used in a process described elsewhere herein for producing transfer media (e.g., polymer films) having CNTs embedded therein (see Examples 1-3).

The catalytic precursor solution 120 on the flat substrate 100 may be patterned via printing, photolithography, or laser writing, for example after spraying, or in lieu of spraying. The preparation and conditioning of the catalytic precursor solution 120 can be done offline.

Shown in FIG. 12 is an alternate version of the invention, similar to the embodiment of FIG. 11, which comprises a plurality of flat substrates 100a which are disposed on and secured to a conveyor assembly 110a. A catalytic precursor solution 120a, as described above, is applied to the flat substrates 100a, via, for example, a spraying mechanism 130a, or any other applicable method (before or after the flat substrates 100a are applied to the conveyor assembly 110a). The conveyor assembly 110a transfers the catalytic flat substrates 100a into a furnace 140a in a reaction zone 170a which receives air via inlet 180a for calcining the catalytic flat substrates 100a, which are then transferred into furnace 150a which receives a reducing gas from inlet 190a for reducing the catalytic flat substrates 110d which are then transferred into furnace 160a, which receives from the reaction zone 170a and from an inlet 200a a carbon-containing gas as discussed elsewhere for causing formation of SWNTs or CNTs on the catalytic flat substrates 100a to form SWNT-bearing catalytic flat substrates 210a having SWNTs 220a thereon. The SWNTs 220a are then removed via a blade 230a or by other means as discussed elsewhere herein. The catalytic flat substrates 100a remain on the conveyor assembly 110a and are used one or more additional times to form SWNTs before being recycled or removed and replaced. The catalytic flat substrates 100a remaining on the conveyor assembly 110a may be eventually treated or cleaned to remove the catalytic precursor solution 120a, and left on the conveyor assembly 110a or may be removed entirely therefrom and replaced with fresh flat substrate 100a, manually or automatically.

Other alternatives of a continuous belt which may be used include roll-to-roll processes (unwind and rewind) or, continuous feeding of flat substrates or plates riding on a conveyor belt.

In alternate embodiments, an annealing step may be included to occur prior to release of the SWNTs from the SWNT-bearing catalytic flat substrates 210 or 210a. Further, a functionalization step may occur, prior to release of the SWNTs, for example by radiation or plasma. The resulting product of this process could be either the SWNTs themselves or the SWNTs attached to the flat substrates.

EXAMPLE 7

Removal of SWNTs in Liquids

When the SWNTs produced on the catalytic flat substrates have to be transferred to a liquid medium, it is convenient to transfer them directly from the catalytic flat substrate to the liquid thereby avoiding intermediate steps. This transfer to a liquid medium can be achieved by dipping the SWNT-bearing catalytic flat substrate into a surfactant solution. In a simple experiment a 2 cm×1 cm piece of V-SWNT-bearing silicon wafer was placed in a vial containing 7 ml of 1.3 mmol/lt NaDDBS solution. Other surfactants can be used. After sonicating the sample for 1 min in a bath sonicator, the V-SWNT film detached and the piece of silicon wafer was removed from the surfactant solution. If a good dispersion of the nanotubes in the liquid media is required, horn sonication can be used to break the nanotube bundles after the wafer has been removed from the surfactant solution. Horn sonication of the surfactant solution with the piece of wafer still inside may results in the contamination of the sample with particles coming from the substrate.

Similar experiments were performed using other surfactants including: Sodium cholate, NaDDBS, CTAB and SDS; and other solvents including: isopropanol, chloroform, dichlorobenzene, THF and different amines. Alternative surfactants that could be used include, but should not be limited to: Surfynol CT324, Aerosol OS, Dowfax 2A1, Dowfax 8390, Surfynol CT131, Triton X-100, Ceralution F, Tween 80, CTAT and Surfonic L24-7. Other compounds such as polysaccharides (e.g., sodium carboxymethylcellulose) could also be used as a "surfactant" to change the wettability of the surface or enhance the SWNT dispersibilty in the liquid media. As an alternative to surfactant solutions, other solvents that can be used include, but are not limited to, alcohols, ketones, aldehydes, ethers, esters, alkanes, alkenes, aromatic hydrocarbons, and mixtures thereof. In some cases, bath sonication might not be required to remove the V-SWNT film from the flat substrate and the V-SWNT film might come off by itself after having been dipped in the solution or after letting the liquid flow on top of the V-SWNT film. In some other cases, stirring or gentle agitation might be used as an alternative to bath sonication. An alternative method to transfer the V-SWNTs to a liquid medium consists of applying a liquid film on top of the V-SWNT material, decreasing the temperature in order to freeze the liquid, mechanically removing the frozen liquid containing the V-SWNTs and mixing the frozen liquid containing the V-SWNTs with more liquid. Alternately, other CNTs, including non-vertically oriented SWNTs or MWNTs could be suspended using these methods.

EXAMPLE 8

Removal of SWNTs in Vacuum/Air

Figure 13:
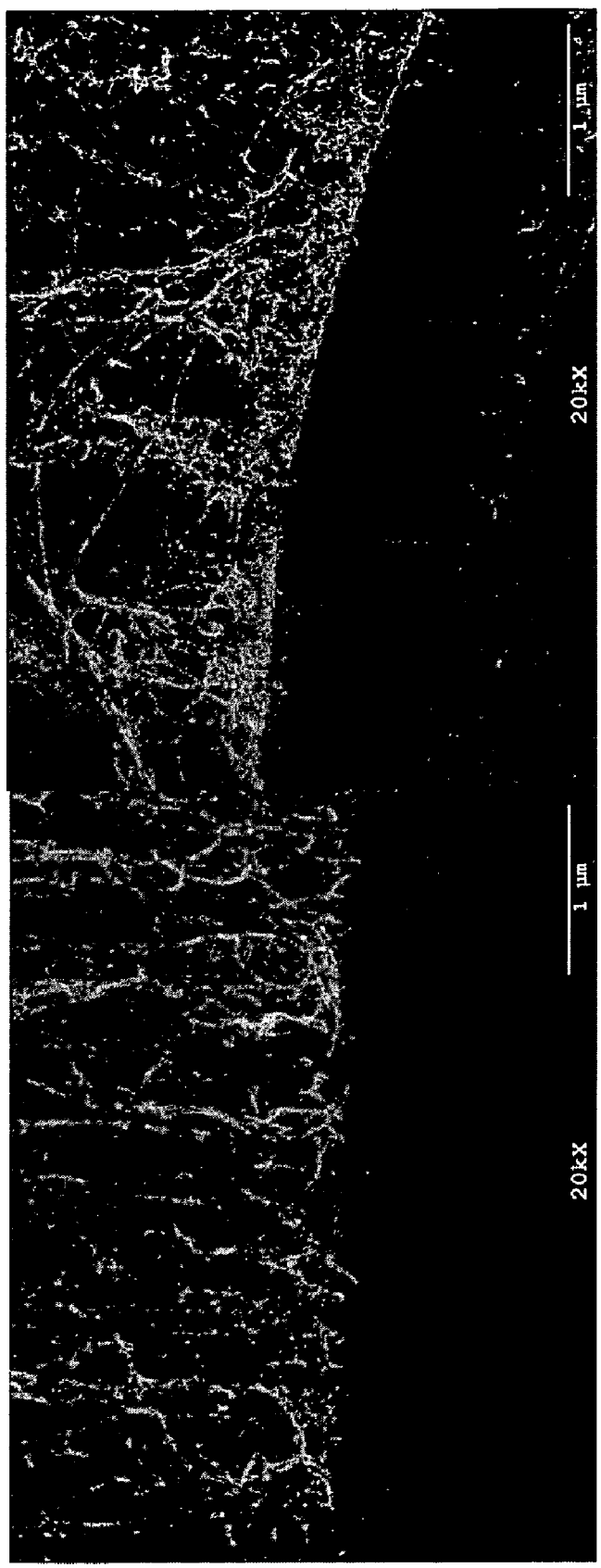
FIG. 13 shows SEM images of V-SWNT as it is detached from the flat surface directly in air. (A) SEM image of V-SWNT attached to the flat surface; (B) SEM image of V-SWNT detached from the flat surface.
Figure 14:
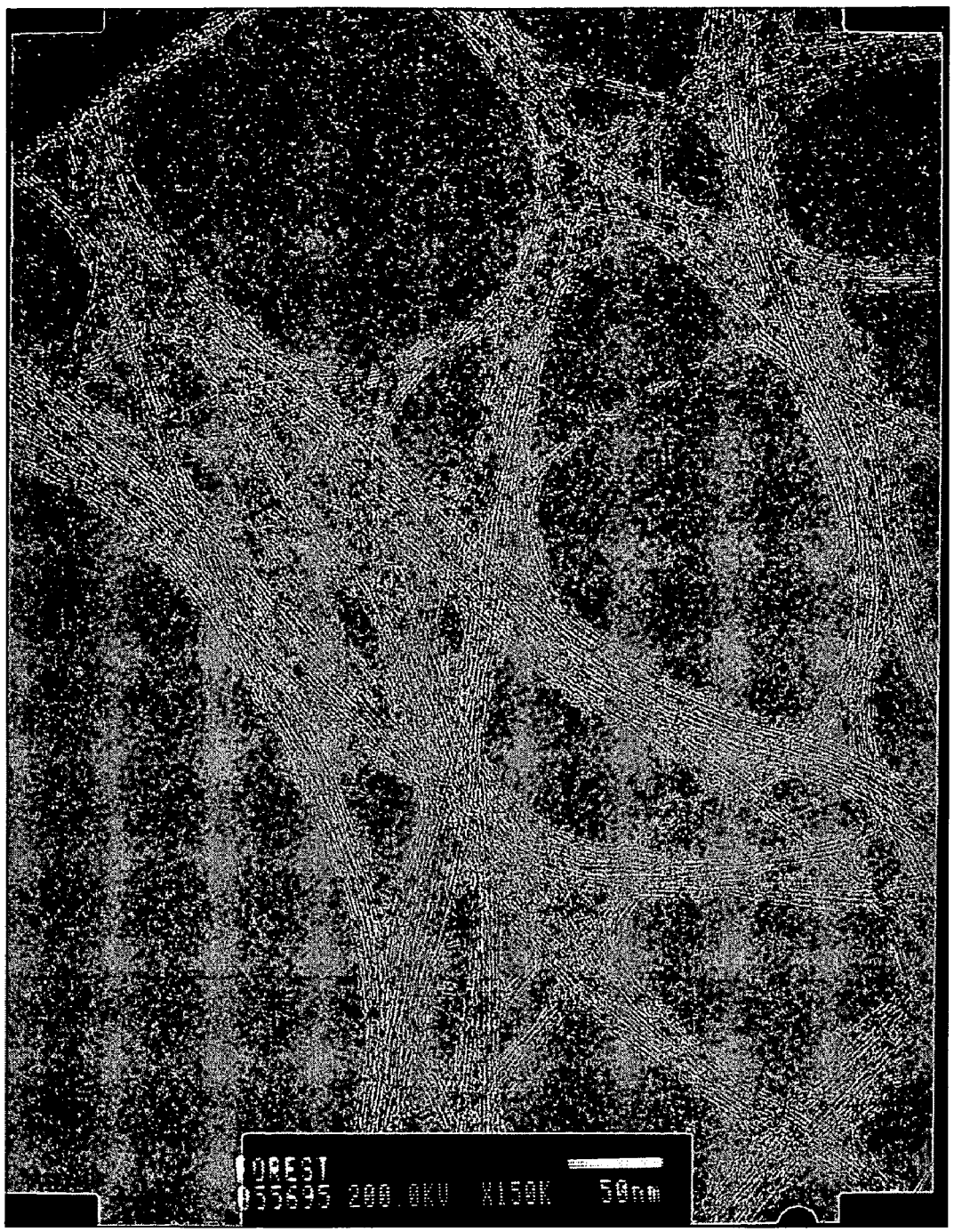
FIG. 14 shows TEM image of V-SWNT showing the absence of metal impurities.

Nanotubes produced on a flat substrates may be removed from the catalytic flat substrate directly in air using several simple methods, such as sweeping the surface with a soft spatula or blade or peeling of the film from the flat substrate (see FIG. 13). In general, it was observed that as the thickness of the nanotube film increased, it was easier to remove the nanotube material. XPS analysis on the catalytic substrate used to grow the nanotubes and TEM and EDXA analysis of the V-SWNT material after it was detached from the catalytic substrate showed that most of the catalytic metal (Co and Mo) remained on the catalytic flat substrate while the nanotube material was free of metal impurities (see FIG. 14), and thus did not substantially pull catalytic material from the flat substrate during removal of the CNTs.

Alternatively, vibrations or a turbulent gas stream could be used to induce the separation of the nanotube material from the flat substrate. The described methods could be used either in air, any other gas or vacuum. The described methods could be performed with the sample at ambient temperature or after the sample has been heated above or cooled below ambient temperature.

EXAMPLE 9

Vertical Alignment of SWNTs During Growth on Flat Substrates Due to the Formation of a Crust of Randomly Oriented Nanotubes In this example, a description is given of the growth of vertically aligned single-walled carbon nanotubes (or V-SWNT) on Co-Mo catalyst supported on a silicon flat substrate. The time evolution of the V-SWNT growth has been examined by scanning electron microscopy (SEM) and resonant Raman spectroscopy. A distinct induction period has been identified, during which a thin layer or 2-dimensional nanotube crust of randomly oriented SWNTs is formed on the substrate. The formation of this crust is followed by the concerted growth of a vertical nanotube "forest" whose height is controlled by the rigid nanotube crust that holds the whole structure together. As a result, all the SWNTs are forced to grow in a substantially aligned fashion. Angle-resolved x-ray absorption near edge structure (XANES) study of the full grown SWNT forest sample was obtained. The intensity of the $C(1s)$-to-$\pi^*$ and $C(1s)$-to-$\sigma^*$ transitions were quantified as a function of incidence angle. A significant deviation of the experimental variation of intensity with incident angle from the theoretical equation that one would expect for perfectly oriented vertical nanotubes was observed at low incidence angles. This deviation is in full agreement with the presence of a crust of nanotubes on an upper surface of the nanotube forest parallel to the upper surface of the substrate. Furthermore, several examples of different forms of SWNTs grown on a flat substrate are given to demonstrate the effect of a nanotube crust structure on the resulting topology of the SWNT forest.

(a) The catalyst of Co and Mo supported on Si wafer was prepared as described in Example 1. After pretreatment, the wafer was placed in a quartz reactor, oriented parallel to the direction of the flowing gas and the SWNT growth was conducted as described above.

(b) The as-produced SWNTs over the catalyst/wafer (catalytic flat substrate) were characterized by Raman spectroscopy, electron microscopy (SEM and TEM), and angle-resolved X-ray near edge structure spectroscopy (XANES). The angle-resolved C K-edge XANES spectra were taken under UHV with total electron yield (TEY) mode at the bending magnet beamline 9.3.2 of Advanced Light Source (ALS) in Lawrence Berkeley National Laboratory (LBNL). The XANES data were collected at various angles ranging from $\theta=10°$ ("glancing geometry") to $\theta=80°$ ("normal geometry"), where $\theta$ denotes the angle between the sample normal and the direction of the electric vector of the X-ray beam.

Figure 15:
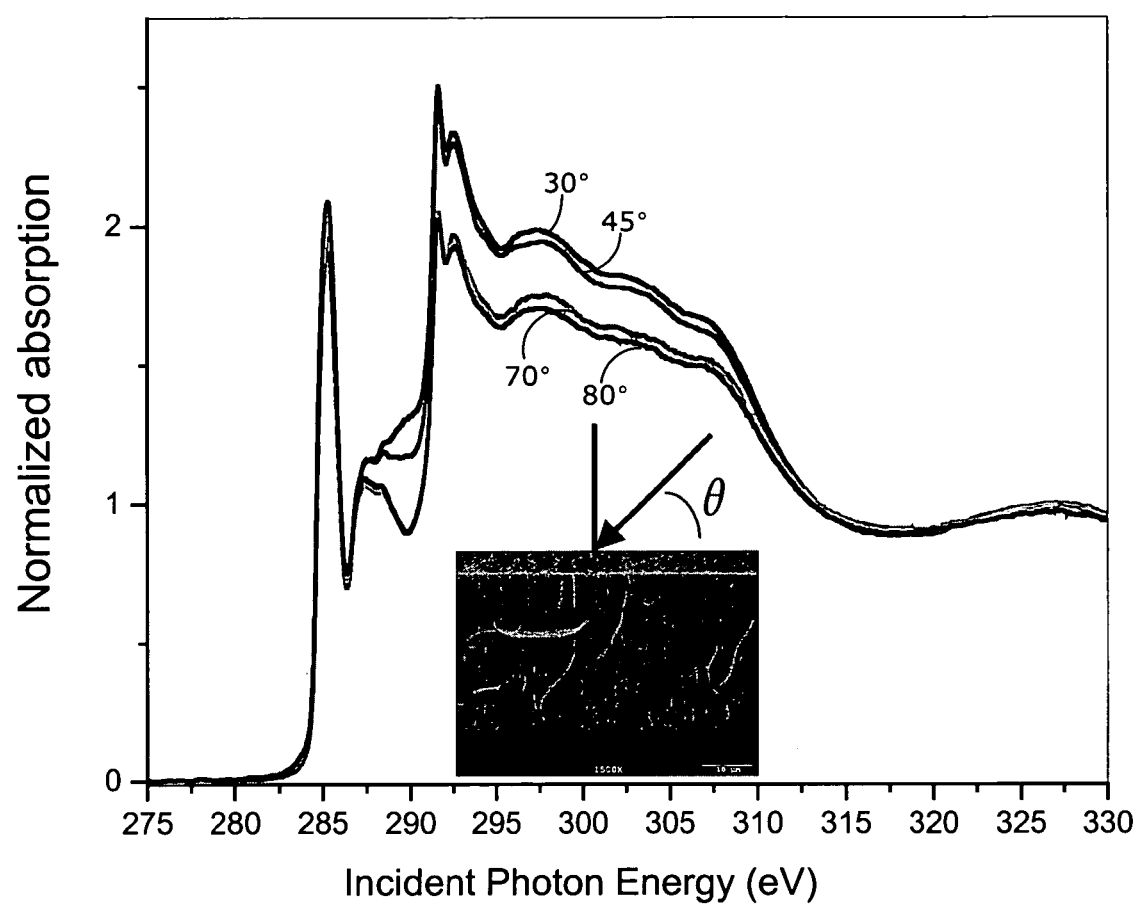
FIG. 15 shows XANES spectra of V-SWNT at different angles of incidence with respect to top surface of V-SWNT.

(c) Results of the XANES characterization: FIG. 15 shows the changes in XANES intensities at different incident angles for SWNT forest, where $\theta$ is also the angle between the sample normal and the electric field vector of the X-ray beam. The pre-edge and post-edge in the XANES spectra were normalized to 0 and 1, respectively. Several characteristic peaks can be identified in each set of the XANES spectra. The C K-edge XANES spectra of SWNTs forest are quite similar to those of graphite, as has also been reported by others. The spectra are characterized by a sharp C—C $\pi^*$ transition near 285.4 eV, a sharp C—C $\sigma^*$ bond excitation near 291.5 eV, two other $\sigma^*$ transitions from 292 to 298 eV and broad ($\sigma+\pi$) transitions from 301 to 309 eV. The position and width of these resonances are typical of C—C single bond. Two small peaks in the 287-290 eV region can be assigned to oxygenated surface functionalities introduced while the SWNT forest were processed. These correspond to $\pi^*$ C=O and $\sigma^*$ C—O resonances. Following the method proposed by Outka and co-workers, the XANES spectra were fitted to a series of Gaussians, an arctangent step corresponding to the excitation edge of carbon, and a background.

The presence of local order and texture in the SWNTs is observed in the angular dependence of the XANES of the SWNT forest. In forests of nanotubes, the nanotubes are expected to point upwardly. Since the synchrotron light is linearly polarized horizontally, the intensity of the $\pi^*$ transition is sensitive to the orientation of the $\pi^*$ orbital with respect to the polarization vector. Thus, if the $\pi^*$ orbitals in the nanotube specimen are partially oriented with respect to the incident photon beam, a rotation of the specimen with respect to the incoming photon will show a measurable angular dependence. At normal incidence, the electric field E is in the same cross section plane as the $\pi^*$ orbitals, and thus, the $\pi^*$ resonance peak will be the highest at this angle, as opposed to at glancing angles. Conversely, when E is normal to the surface, the field lies along the tube axis (along z) and is perpendicular to the plane of the $\pi^*$ orbitals, the intensity of the $\pi^*$ resonance is at its minimum. Specifically, there is an increase in the intensity of the $\pi^*$ resonance with increasing angle of X-ray beam incidence. The local contribution to the $\pi^*$ excitation XAS intensity is proportional to the square of the scalar product of the local normal and E. Obviously the $\pi^*$ resonance intensity is proportional to the sine-squared function of the incidence angle. A plot of the $\pi^*$ excitation vs the incidence angle shows a sine-squared dependence as shown in lower panel of FIG. 16.

Figure 16:
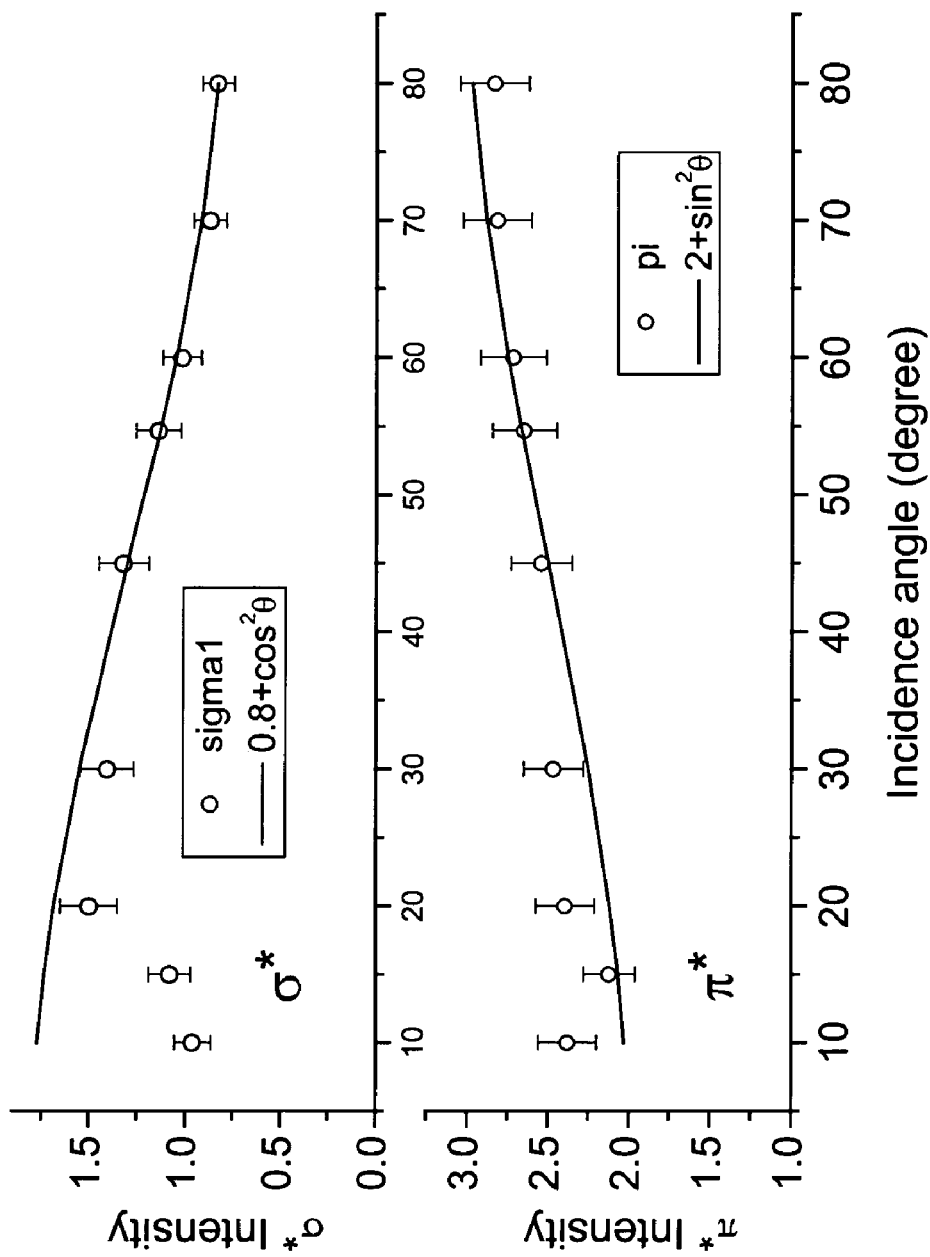
FIG. 16 shows graphs with experimental and fitted data of σ* and π* peak intensity.
Figure 17:
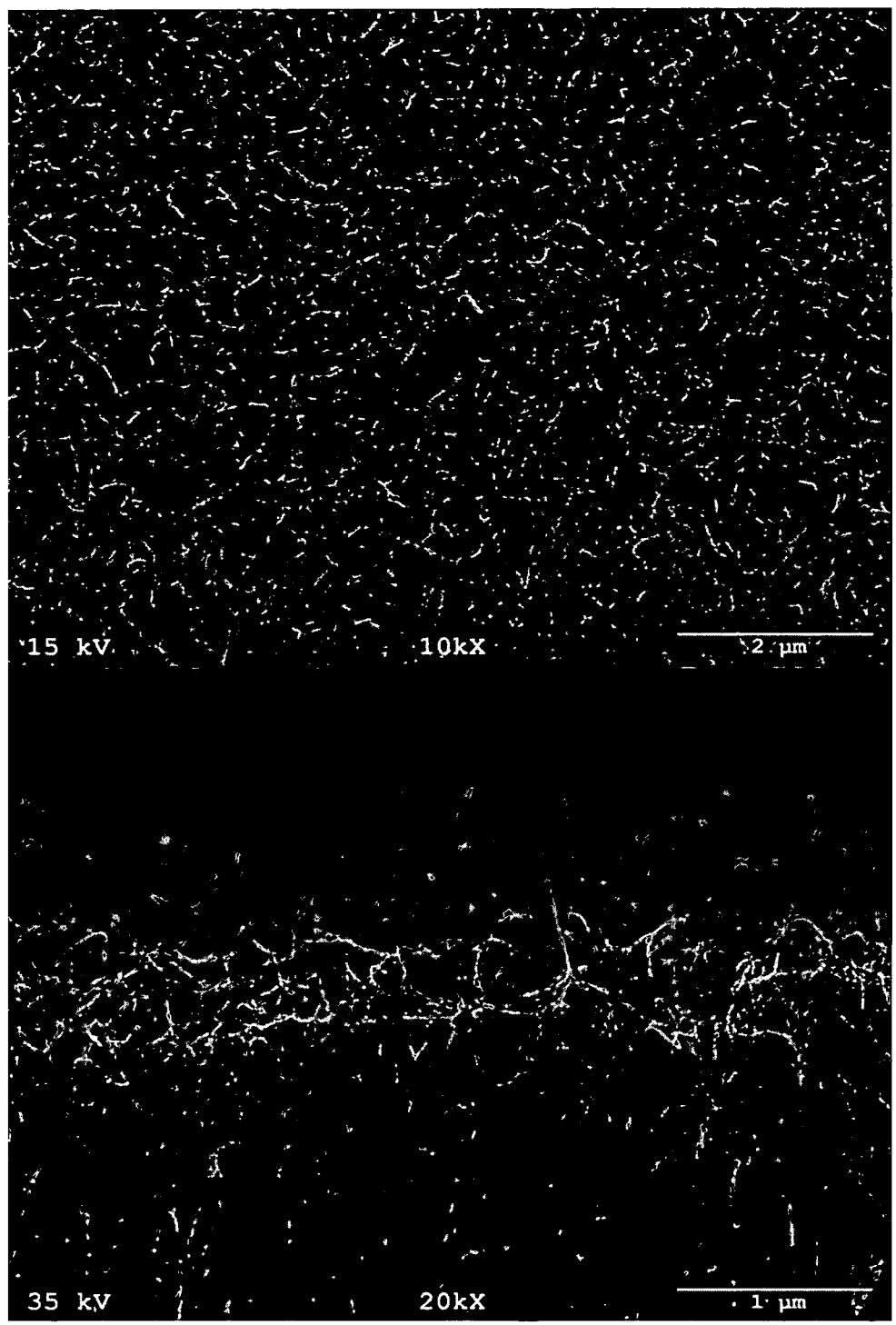
FIG. 17 shows SEM micrographs of top (A) and side (B) views of a typical V-SWNT sample by SEM.

However, a C—C $\sigma^*$ orbital orthogonal to the $\pi^*$ orbital will show an opposite trend. The $\sigma^*$ orbitals can be viewed as combination of two perpendicular components, one is parallel to tube axis direction ($\sigma^*//$), another along circumferential direction (also perpendicular to the tube axis, $\sigma^{*\perp}$), as seen in upper panel FIG. 16. The local contribution to the $\sigma^*$ excitation XAS intensity at 291.5 eV is proportional to the sum of the squared scalar products of the two components and electric polarization vector. With a simple calculation by accounting for all $\sigma^*$ contributions on the entire tube circumference, we found the intensity of the $\sigma^*$ bound resonance at 291.5 eV is proportional to $(1+\cos 2\theta)$. The intensity of the excitation has a cosine-square dependence with respect to the incidence angle as shown in FIG. 16. It is quite different from the observation of SWNT buckypaper, which resonances do not appear to be a systematic variation in intensity with incidence angle due the randomly distributed order of the tubes. Noticeable deviation of fitted data from experimental data are observed for both $\sigma^*$ and $\pi^*$ transition at low angles. Considering the mechanism discussed above, it is obvious to infer the presence of a crust with nanotubes oriented parallel to the substrate at the top of the V-SWNT. The presence of this crust is further supported by the SEM images of FIG. 17, which shows over the forest, SWNT oriented parallel to the surface in a random 2-dimensional network.

(d) Time-Evolution of the V-SWNT Growth.

Figure 18:
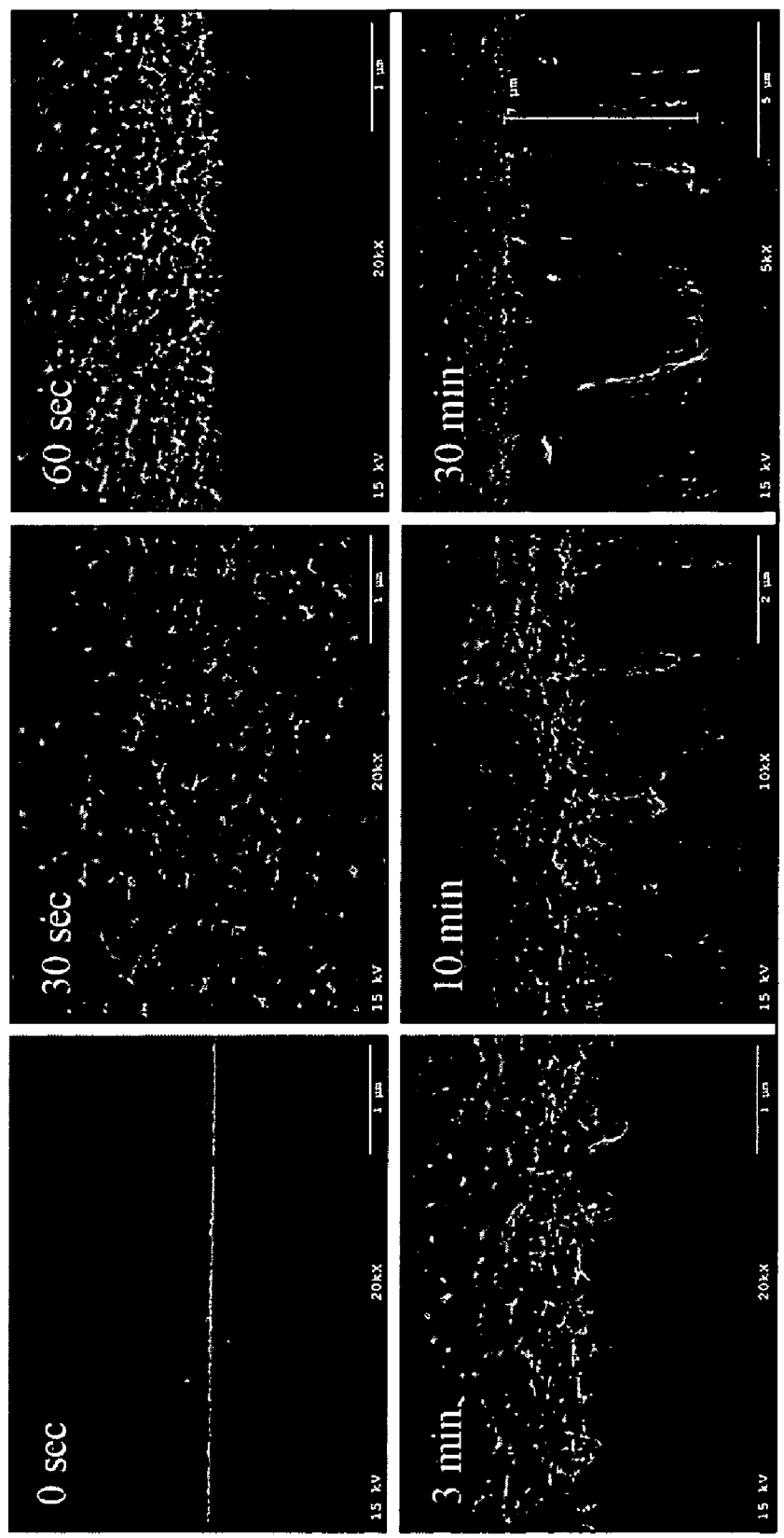
FIG. 18 shows SEM images of V-SWNTs obtained for a series of reaction time period. The scale bars in those images are 1 µm for 0, 30, 60 seconds and 3 minutes, 2 µm for 10 minutes and 5 µm for 30 minutes.

In order to investigate the mechanism of formation of the V-SWNT structure, we inspected the system at each stage of the growth process. The morphology of V-SWNT was observed by SEM after different reaction times. The results are summarized in the series shown in FIG. 18. Starting from a flat substrate with no carbon deposition, short SWNT bundles evolve after 30 seconds at some catalytically preferential spots which is probably because of geometrical and compositional difference in Co-Mo particles. But at this stage a continuous film of SWNTs has not been formed yet. During the following 30 seconds, almost all the particles which are capable to nucleate caps that can grow into SWNT have been activated. Subsequently, the SWNTs grow thereby lifting the caps. As a result (after 60 sec.), a thin layer of randomly oriented SWNTs has been woven. At 3 minutes, a uniform crust with very short aligned SWNT bundles underneath can be clearly seen. The entangling of SWNT bundles due to different growth rates and random orientation appears to stop at this stage. Instead, the growth rate of each individual bundle is averaged by the constraint imposed by the crust. Consequently (10 min. and 30 min.), a macroscopically uniform growth and alignment of the SWNTs occurs synchronically.

Figure 19:
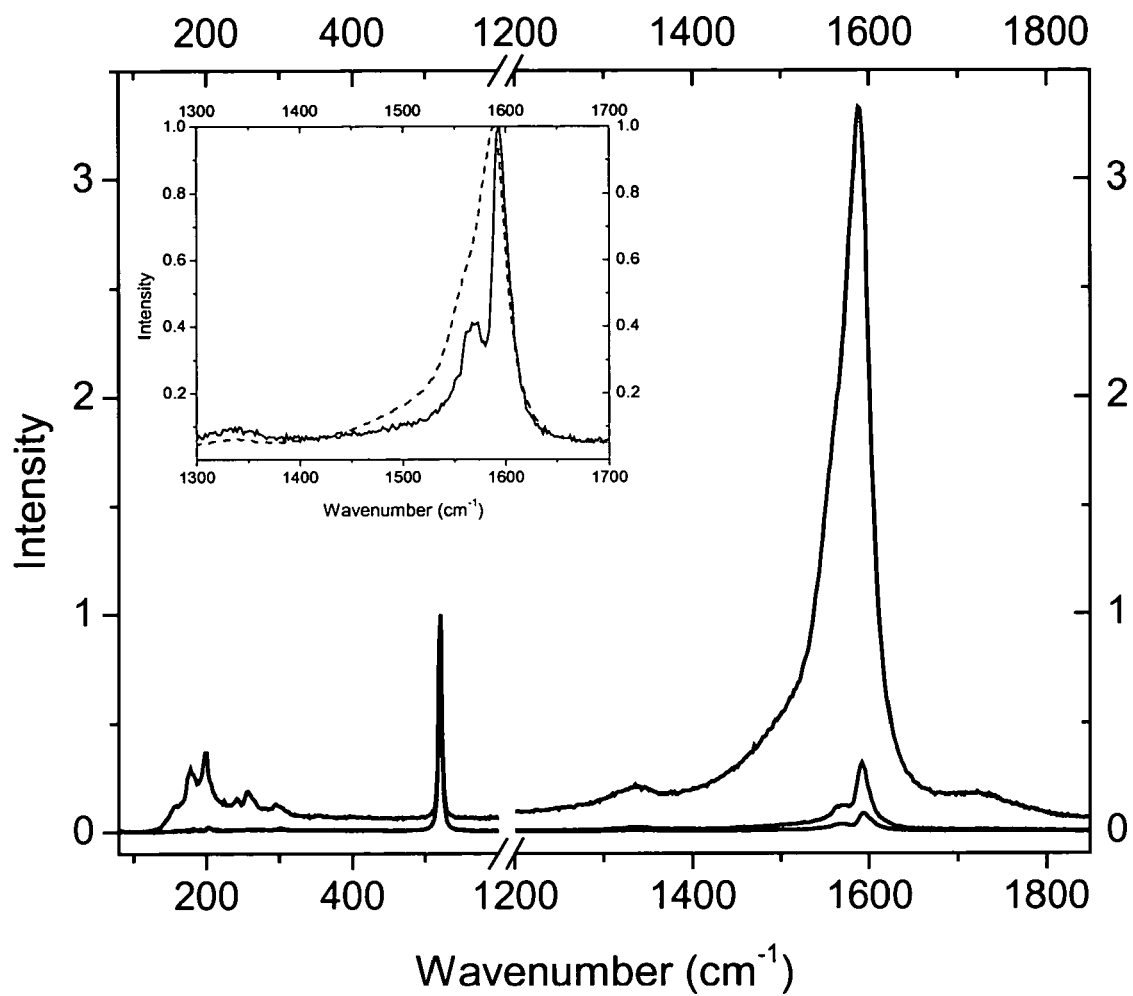
FIG. 19 shows Raman spectra of V-SWNT obtained for a series of reaction time period: 0.5 minutes, 3 minutes and 10 minutes from bottom to top. These 3 curves are normalized with respect to Si band at 520 cm$^{-1}$. The inset is G band of V-SWNT obtained for 0.5 minutes (solid line) and 10 minutes (dashed line) respectively when normalized with respect to G band.

In addition to SEM, resonant Raman spectroscopy has been performed on the time evolved V-SWNT samples. FIG. 19 shows the Raman spectrum of V-SWNT produced in time period of 0.5 min, 3 min and 10 min. Raman features include G band at 1590 cm$^{-1}$, D band at 1340 cm$^{-1}$ and radial breathing mode at 150~300 cm$^{-1}$ which are typical for V-SWNT. The peak at 520 cm$^{-1}$ is characteristic of inelastic scattering on silicon, whose intensity is dependent on distance from the focal plane of laser which is determined by height of V-SWNT and area covered by SWNT. In FIG. 19, three spectra are normalized to the Si band and the amount of V-SWNT can be estimated by the size of the G band. It is clearly shown that the intensity of the G band increases with time. Interestingly, the shape of G bands for the crust formed during the initial moments (0.5 min) and for the V-SWNT formed after 10 min are different. As shown in the inset after normalization, the V-SWNT sample shows convergent G− and G+ and a broader peak base in contrast with the sharper lines and more pronounced separation of the G− and G+ corresponding to the crust.

The data in this example indicate that (1) the growth of a V-SWNT forest requires a very important step (referred to as the induction period), during which a thin layer (crust) composed of entangled randomly-oriented SWNT bundles is formed initially as a guiding surface for the growth of vertically aligned SWNTS, and (2) after the nanotube crust is formed, the subsequent growth of SWNT underneath is limited by the crust, thereby causing all the nanotubes to have substantially the same length.

Changes may be made in the construction and the operation of the various compositions, components, elements and assemblies described herein or in the steps or the sequence of steps of the methods described herein without departing from the scope of the invention.

What is claimed is:

1. A carbon nanotube structure, comprising:
   a catalytic flat substrate having a catalytic surface;
   a first carbon nanotube layer comprising randomly-oriented carbon nanotubes; and
   a second carbon nanotube layer comprising vertically-oriented carbon nanotubes, and
   wherein the first nanotube layer is disposed as an outer crust upon the second nanotube layer such that the second nanotube layer is positioned between the first nanotube layer and the catalytic surface of the flat substrate.

2. The carbon nanotube structure of claim 1 wherein the carbon nanotubes are primarily single-walled carbon nanotubes.

3. The carbon nanotube structure of claim 1 wherein the catalytic flat substrate is prepared from a material selected from the group consisting of $SiO_2$, Si, p-doped Si, n-doped Si, p-doped Si with a $SiO_2$ layer, n-doped Si with a $SiO_2$ layer, $Si_3N_4$, $Al_2O_3$, MgO, quartz, glass, oxidized silicon surfaces, silicon carbide, ZnO, GaAs, GaP, GaN, Ge, InP, iron, steel, stainless steel, molybdenum, alumina, magnesia and titania or combinations thereof.

4. The carbon nanotube structure of claim 1 wherein the catalytic surface comprises catalytic islands thereon comprising one or more metal selected from the group consisting of Group VIII metals, Group VIb metals, Group Vb metals and Re.

5. The carbon nanotube structure of claim 1 wherein catalytic islands are formed on the catalytic surface, and wherein the catalytic islands are separated by an average distance of 30 nm to 100 nm.

* * * * *